(12) United States Patent
Shidoji et al.

(10) Patent No.: US 6,863,785 B2
(45) Date of Patent: Mar. 8, 2005

(54) SPUTTERING APPARATUS AND SPUTTER FILM DEPOSITION METHOD

(75) Inventors: Eiji Shidoji, Yokohama (JP); Eiichi Ando, Yokohama (JP); Tomohiro Yamada, Yokohama (JP); Takahiro Mashimo, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/635,816

(22) Filed: Aug. 7, 2003

(65) Prior Publication Data

US 2004/0026240 A1 Feb. 12, 2004

Related U.S. Application Data

(63) Continuation of application No. PCT/JP02/00982, filed on Feb. 6, 2002.

(30) Foreign Application Priority Data

| Feb. 7, 2001 | (JP) | 2001-031004 |
| Jul. 23, 2001 | (JP) | 2001-220942 |
| Dec. 17, 2001 | (JP) | 2001-383069 |

(51) Int. Cl.[7] ............................................. C23C 14/35
(52) U.S. Cl. ...................... 204/192.13; 204/298.17; 204/298.28; 204/298.03; 204/298.06; 204/298.08
(58) Field of Search .................. 204/192.13, 298.03, 204/298.06, 298.08, 298.12, 298.17, 298.28

(56) References Cited

U.S. PATENT DOCUMENTS 5,154,810 A * 10/1992 Kamerling et al. .... 204/192.13
6,338,777 B1 * 1/2002 Longstreth White ... 204/192.15

FOREIGN PATENT DOCUMENTS

| EP | 1 046 727 | 10/2000 |
| JP | 49-115085 | 11/1974 |
| JP | 3-253568 | 11/1991 |
| JP | 4-173971 | 6/1992 |
| JP | 5-21347 | 1/1993 |
| JP | 5-222530 | 8/1993 |
| JP | 5-222531 | 8/1993 |
| JP | 6-207269 | 7/1994 |
| JP | 6-212421 | 8/1994 |
| JP | 7-109569 | 4/1995 |
| JP | 8-325725 | 12/1996 |
| JP | 10-330934 | 12/1998 |
| JP | 11-241162 | 9/1999 |
| JP | 2001-3166 | 1/2001 |

OTHER PUBLICATIONS

English translation of JP 7–109569.*

* cited by examiner

*Primary Examiner*—Steven Versteeg
(74) *Attorney, Agent, or Firm*—Oblon, Spivak, McClelland, Maier & Neustadt, P.C.

(57) ABSTRACT

A sputtering apparatus and a sputter film deposition method, which includes a conventional magnetron and an AC magnetron for deposition of a low refractive index film, and a conventional magnetron and an AC magnetron for deposition of a high refractive index film, performs film deposition by each of the AC magnetrons until having achieved 90% of a designed film thickness, and then performs the film deposition only by each of the conventional magnetrons, and which can control the film thickness with high precision and have excellent productivity.

34 Claims, 34 Drawing Sheets

Fig. 8

| | Target material | Film material |
|---|---|---|
| Low refractive index material | Si | $SiO_2$ |
| | SiC | $SiO_2$ |
| | Alloy of Si and Al | $SiO_2 + Al_2O_3$ |
| High refractive index material | Ti | $TiO_2$ |
| | Ta | $Ta_2O_5$ |
| | Zr | $ZrO_2$ |
| | Zn | ZnO |
| | Nb | $Nb_2O_5$ |

Fig. 9

Examples of substrate used in the present invention

| For WDM | WMS manufactured by OHARA Corporation (glass ceramics) |
|---|---|
| For optical filter | Colorless sheet glass (high transmittance glass) |
| | Hard glass (low expansion glass) |
| | Artificial crystal |
| | Quartz |
| | BK-7 (optical glass) manufactured by Schott Corporation |
| | Fluorophosphate glass |
| | Borosilicate glass |

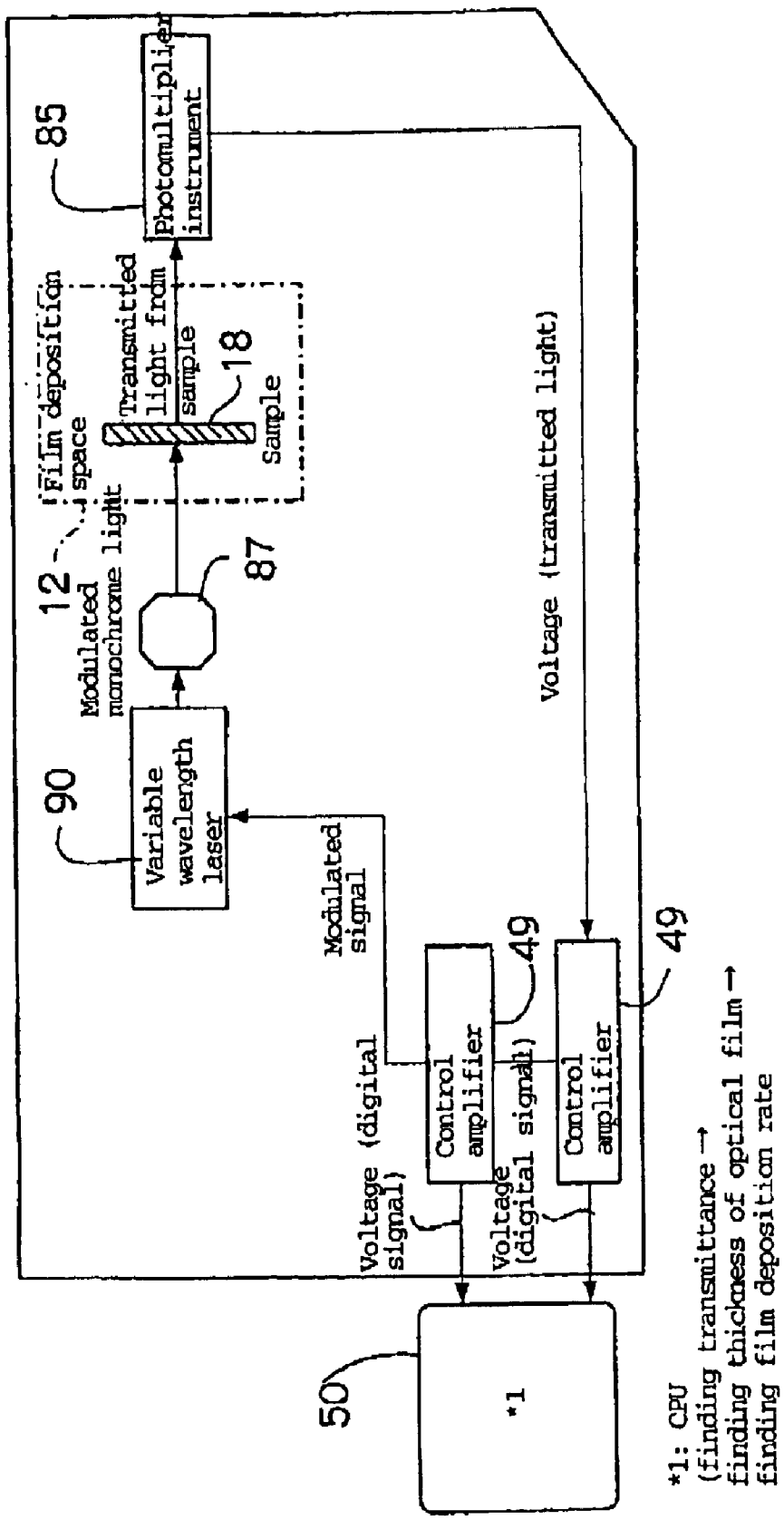

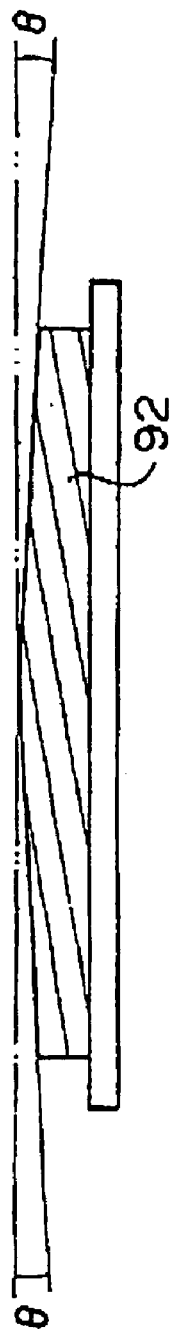
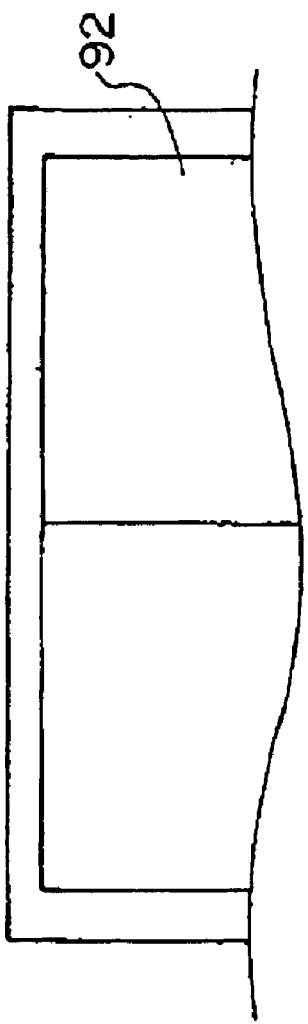
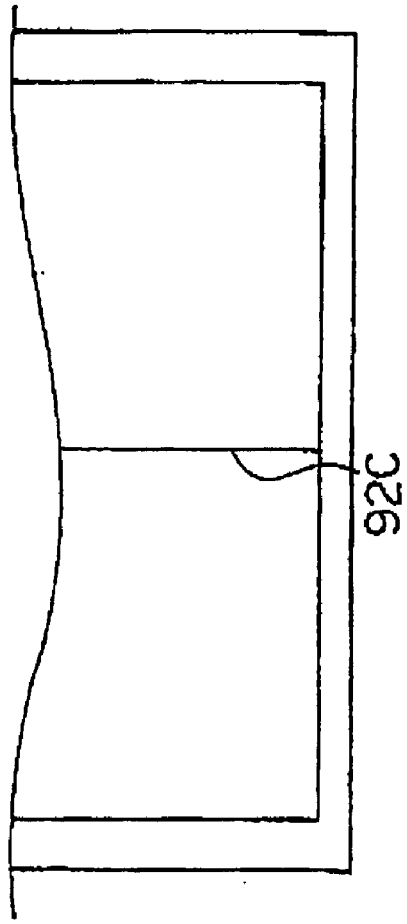
Fig.14(a)
Fig.14(b)

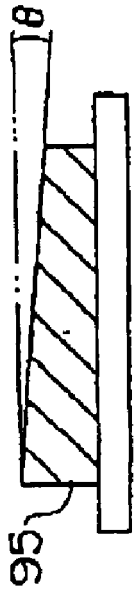
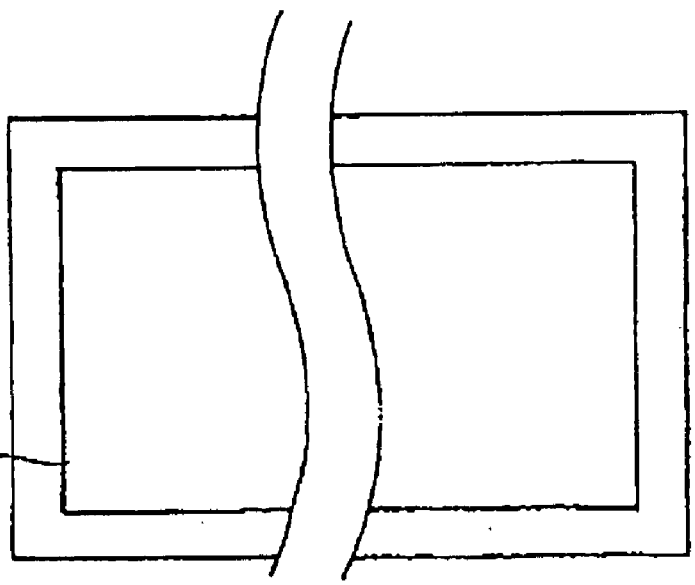
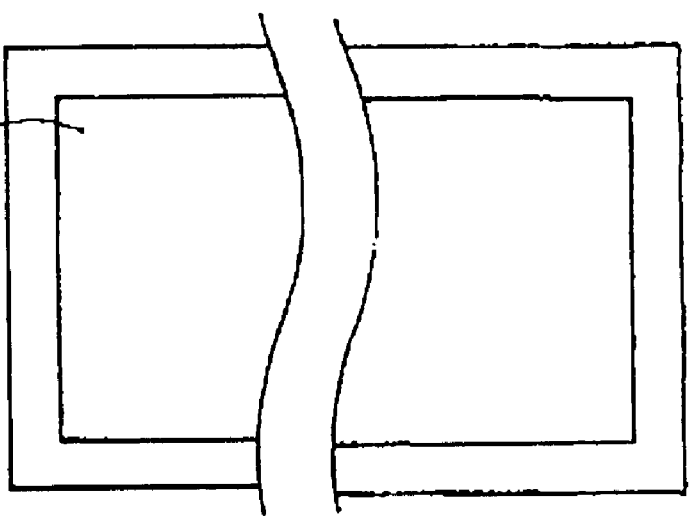

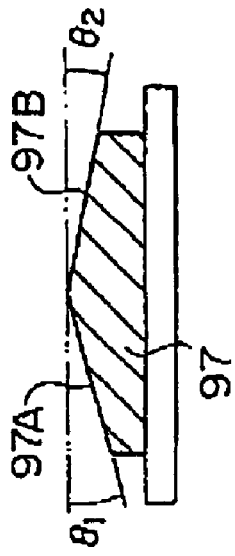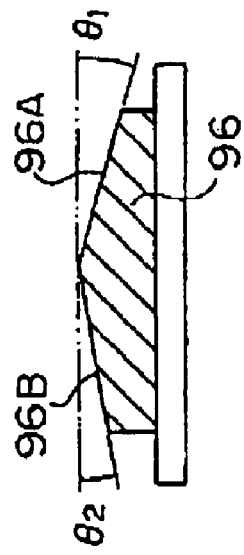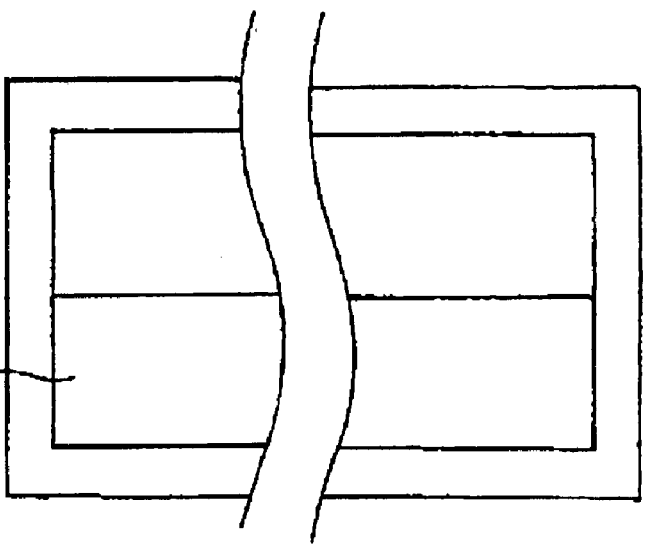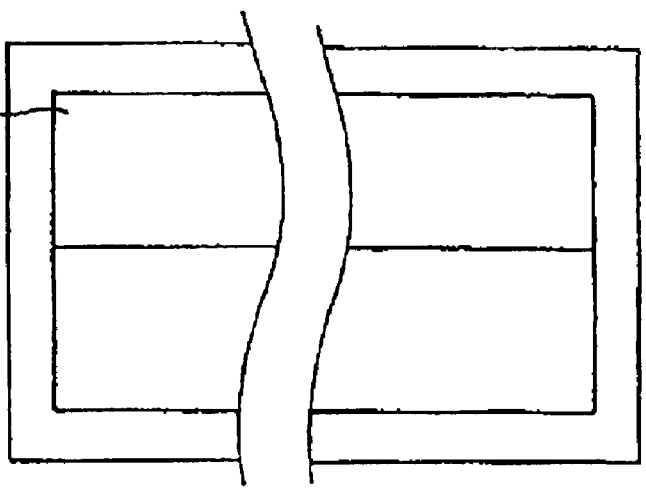

Change in transmittance of light having wavelength of 550 nm when $TiO_2$ (n=2.4) is deposited on glass substrate Spectral transmittance for BPF having 29 layers and one cavity, and transmittance approximately converted based on measurement at incident wavelength of 550 nm — Actual spectral transmittance
—•— Approximately converted spectral transmittance Spectral transmittance for BPF having 29 layers and one cavity, and transmittance approximately converted based on measurement at incident wavelength of 549 nm — Actual spectral transmittance
· Approximately converted spectral transmittance

Fig. 34

Example of film structure and film deposition method

| Film deposition method | Kind of film | Number of film layer | Total film thickness (target) | Required precision of film thickness | Substrate holder Number of revolution (rpm) | Application |
|---|---|---|---|---|---|---|
| | Antireflective film | 1 to 4 layers (single side) | 0.1 to 0.3 μm | 1 to 5% or less | | Various kinds of cameras Displays etc. |
| AC (rapid deposition) method | Infrared reflective film Ultraviolet reflective film Ultraviolet/infrared reflective film Visual light reflective film Polarized separating film | 15 to 50 layers | 1.5 to 4.0 μm | 1% or less | 8 to 60 rpm | Lighting equipment Projectors Various kinds of cameras Displays etc. |
| Method wherein AC (rapid deposition) and DC (slow deposition) are combined | Band pass filter | 100 to 200 layers | 25 to 35 μm | 0.01% or less | 4 to 20 rpm | For WDM communication |
| | Gain flattening target | 30 to 40 layers | 20 to 25 μm | 0.01% or less | | |

Fig. 36

Evaluation result for film property

| | AC sputtering 10 layers 2.0 μm | DC sputtering 26 layers 3.0 μm | Product formed by vapor deposition 34 layers 4 μm |
|---|---|---|---|
| Film deposition rate ($SiO_2$) | 42 nm·m/min | 11 nm·m/min | - |
| ($Ta_2O_5$) | 52 nm·m/min | 6 nm·m/min | - |
| Film stress ($SiO_2$) | -218 MPa | -67 MPa | - |
| ($Ta_2O_5$) | -78 MPa | -217 MPa | - |
| Refractive index ($SiO_2$) | 1.472 at 550 nm | 1.460 at 550 nm | - |
| ($Ta_2O_5$) | 2.17 at 550 nm | 2.10 at 550 nm | - |
| Extinction coefficient ($SiO_2$) | < $10^{-4}$ | < $10^{-4}$ | - |
| ($Ta_2O_5$) | < $10^{-4}$ | < $10^{-4}$ | - |
| Haze value | 0.0% | 0.3% | 0.3% |
| Smoothness (Ra) | 0.32 nm | 0.30 nm | 2.22 nm |
| Wavelength shift (60°C, 90%RH, 120 h) | < 1 nm | < 1 nm | Less than 2 nm |

(With respect to film deposition rate, film stress, refractive index and extinction coefficient, result for single film of 500 nm)

Fig.37

Film property required for multilayer optical film

| | Targeted value |
|---|---|
| Film stress<br>($SiO_2$)<br>($Ta_2O_5$) | Within range of ±300 MPa |
| Refractive index<br>($SiO_2$)<br>($Ta_2O_5$) | 1.45 or more and 1.48 or less<br>2.15 or more and 2.25 or less |
| Extinction coefficient<br>($SiO_2$)<br>($Ta_2O_5$) | $< 10^{-4}$<br>$< 10^{-4}$ |
| Haze value | $< 0.1\%$ |
| Smoothness (Ra) | $< 1.0$ nm |
| Wavelength shift<br>(60°C, 90%RH, 120 h) | $< 1$ nm |

SPUTTERING APPARATUS AND SPUTTER FILM DEPOSITION METHOD

TECHNICAL FIELD

The present invention relates to a sputtering apparatus and a sputter film deposition method, which are applicable to a film deposition process for, e.g., an optical filter, in particular, a sputtering apparatus and a sputter film deposition method, which are appropriate for production of a WDM filter for used in a WDM (Wavelength Division Multiplexing) technique.

BACKGROUND ART

JP-A-3-253568 has disclosed a carousel-type sputtering apparatus for depositing a film on a substrate, such as a glass substrate. The carousel-type sputtering apparatus is a rotary batch-type sputtering apparatus, which is configured so that a substrate holder (rotary drum) formed in a polygonal and cylindrical shape are included in a chamber, and magnetrons with rectangular targets held therein are provided inside the chamber. Film deposition is performed by supplying the magnetrons with power to generate plasma on outer surfaces of the targets while rotating the substrate holder with substrates mounted thereon and introducing reaction gases into the chamber.

JP-A-11-241162 has proposed a sputtering method, which continuously monitors a film thickness during film deposition by use of an optical measuring instrument.

Recently, the WDM filer, which has been used in the WDM technique drawing attention in the field of optical fiber communication, is formed by depositing remarkably many films in layers (e.g., about 100 layered films) with films made of a low refractive index material (e.g., $SiO_2$ films) and films made of a high refractive index material (e.g., $Ta_2O_5$ films) alternately layered. In production of such a multilayer optical film, it is important for each of the films to be deposited so as to have a desired film thickness accurately as designed. There has been a demand to develop a technique for depositing the respective films rapidly with high precision.

FIG. 27 is a schematic view of a conventional sputtering apparatus for depositing a multilayer optical film. In the sputtering apparatus, a substrate holder 202 formed in a polygonal and cylindrical shape is housed in a substantially cylindrical chamber 200, and the substrate holder 202 has substrates 204 mounted on respective side surfaces. The chamber includes a magnetron sputtering source for deposition of low refractive index films 206 and a magnetron sputtering source for deposition of high refractive index films 208. The former magnetron sputtering source has a target for deposition of low refractive index films (e.g., a Si target) 210 mounted thereon, and the latter magnetron sputtering source has a target for deposition of high refractive index films (e.g., a Ti target) 212 mounted thereon.

The substrate holder 202 is rotated about a central shaft 214. A low refractive index film is deposited on the respective substrates 204 passing in front of the target 210 by supplying power from a sputtering power supply 216 to the magnetron sputtering source 206 to generate plasma in the vicinity of an outer surface of the target 210, and reacting the generated plasma with a gas supplied from a gas inlet tube, which is not shown. Likewise, a high refractive index film is deposited on the respective substrates 204 by supplying power from a sputtering power supply 218 to the magnetron sputtering source 208 to generate plasma on an outer surface of the target 212, and reacting the generated plasma with a gas supplied from the gas inlet tube. The amount of film deposition and the turn-on time periods for the sputtering power supplys 216, 218 (film deposition rate) are previously checked out. A desired multilayer film is deposited by alternately supplying power to the magnetron sputtering sources 216, 218 while controlling the sputtering time periods.

However, the conventional film deposition apparatuses have been difficult to control film thicknesses with high precision. The conventional film deposition apparatuses have caused a problem that productivity is significantly decreased since the film deposition rate needs to be lowered in order to increase the precision of film thicknesses.

JP-A-49-115085 has proposed a method wherein power is intermittently supplied to a sputtering apparatus in a film deposition process, the film thicknesses are measured in turn-off periods (periods without power being supplied), and the measurement results are fed back to a power supply system, though no carousel type sputtering apparatus is referred to in the publication. This method is disadvantageous in that productivity is low since film deposition processes and measuring processes are alternately performed and since film deposition is interrupted during measurement.

In a case wherein each of the film thicknesses is uniformed by a sputtering apparatus (method) using two cathodes and two power supplies for supplying power to the cathodes as disclosed in JP-A-3-253568, the differences between the two cathodes need to be made small with respect to factors affecting the film deposition rate (such as magnetic fields, applied voltages, the surface states of the targets, and gas pressures). However, it is not easy to make each of the film thicknesses uniform since it is difficult to equalize the conditions of both cathodes.

The present invention is proposed in consideration of the circumstances. It is an object of the present invention to provide a sputtering apparatus and a sputter film deposition method, which are capable of controlling film thicknesses with high precision and have excellent productivity. It is another object of the present invention to provide a sputtering apparatus and a sputter film deposition method, which are capable of achieving uniform film deposition more simply than the conventional techniques, making the size of the apparatus smaller and lowering the cost.

DISCLOSURE OF THE INVENTION

In order to attain the objects, according to a first aspect of the present invention, there is provided a carousel-type sputtering apparatus which is configured so that a drum, which is formed in a polygonal or circular shape in transverse cross-section, is provided so as to be rotatable in a chamber, the drum having substrate holders provided on an outer peripheral surface; magnetron sputtering sources are provided inside a chamber wall; each of the magnetron sputtering sources comprises a target and a magnetron unit for holding the target; and the targets are held so as to be parallel with a rotary axis of the drum by the magnetron units; and which comprises a film thickness measuring instrument, which measures a thickness of a film deposited on a substrate mounted on a substrate holder during film deposition; a power supply unit, which supplies the respective targets with power required for sputtering; and a controller, which controls parameters affecting on an amount of film deposition based on measurement results obtained by the film thickness measuring instrument.

In accordance with the present invention, it is possible to control a carousel-type sputtering apparatus such that the film thickness is monitored during film deposition, and information on the film thickness is fed back to a control system. The parameters affecting on the amount of film deposition may be controlled by adjusting the rotational speed of the substrate holders (drum), the opening and closing degree of shutters, a sputtering pressure and the like in addition to power supplied to the sputtering power supply units. For example, when the film deposition is stopped, the power supply to the sputtering power supply units is stopped or the shutters are closed.

As another mode of the present invention, the sputtering apparatus according to a second aspect of the present invention is characterized in that each of the magnetron sputtering sources comprises an AC magnetron sputtering source and a magnetron sputtering source with a target mounted on a single magnetron unit, the AC magnetron sputtering source having two adjacent targets provided thereon such that an anode/cathode relationship between the two targets is alternately changed by a frequency.

Examples of the magnetron sputtering source with a target mounted on a single magnetron unit are a RF (radiofrequency) magnetron sputtering source and a pulse magnetron sputtering source (wherein a d.c. voltage is applied at constant intervals) in addition to a DC (direct current) magnetron sputtering source.

The AC magnetron sputtering source can perform more rapid film deposition than the magnetron sputtering source with a target mounted on a single magnetron unit. In accordance with the present invention, these two kinds of sputtering sources are combined to realize rapid and high precision film deposition.

In a mode of this case, rapid film deposition is performed by an AC magnetron sputtering source from start of film deposition, the film deposition by the AC magnetron sputtering source is stopped after the thickness of the film has achieved a value just smaller than a targeted film thickness, and then the rapid film deposition is changed to slow film deposition only by use of a magnetron sputtering source with a target mounted on a single magnetron unit to perform the film deposition up to achievement of the targeted film thickness, which is proposed as a third aspect of the present invention. By this arrangement, it is possible to control the film thickness with high precision.

It is preferable that the thickness of the film is monitored by the film thickness measuring instrument during slow film deposition, and that when it is detected that the thickness of the film has achieved the targeted film thickness, the film deposition by the magnetron sputtering source with a target mounted on a single magnetron unit is stopped, which is proposed as a fourth aspect of the present invention. Normally, the film thickness is constantly monitored.

It is possible to control the film thickness with higher precision by monitoring the film thickness in a time period wherein slow film deposition is performed only by the magnetron sputtering source with a target mounted on a single magnetron unit, and feeding back information on the monitored film thickness to the control system.

A fifth aspect of the present invention provides a carousel-type sputtering apparatus which is configured so that a drum, which is formed in a polygonal or circular shape in transverse cross-section, is provided so as to be rotatable in a chamber, the drum having substrate holders provided on an outer peripheral surface; and magnetron sputtering sources are provided inside a chamber wall, each of the magnetron sputtering sources comprising a target and a magnetron unit for holding the target, and the targets being held so as to be parallel with a rotary axis of the drum by the magnetron units; and which comprises the magnetron sputtering sources including only AC magnetron sputtering sources, each of which has two adjacent targets provided thereon such that an anode/cathode relationship between the two targets is alternately changed by a frequency; a film thickness measuring instrument, which measures a thickness of a film deposited on a substrate mounted on a substrate holder during film deposition while rotating the drum; a power supply unit, which supplies the respective targets with power required for sputtering; and a controller, which controls parameters affecting on an amount of film deposition, based on measurement results obtained by the film thickness measuring instrument.

When a multilayer film having a permissible error on the order of 1% is formed, it is possible to form the required multilayer film by using only the AC magnetrons for rapid film deposition.

In order to apply the present invention to an apparatus to alternately deposit low refractive index films and high refractive index films, such as an apparatus for depositing an optical multilayer film for production of WDN filters or the like, a sputtering apparatus, wherein the magnetron sputtering sources are a combination of a magnetron sputtering source for mounting a target for deposition of a low refractive index film, and a magnetron sputtering source for mounting a target for deposition of a high refractive index film according to a sixth aspect of the present invention, may be used.

It is possible to realize rapid film deposition and high precision film thickness control in the film deposition process for low refractive index films and the film deposition process for high refractive index films by using a combination of the AC magnetron sputtering source and the magnetron sputtering source with a target mounted on a single magnetron in each of the magnetron sputtering source for deposition of low refractive index films and the magnetron sputtering source for deposition of high refractive index films.

The present invention is operable even in a mode wherein the film deposition is performed only by the AC magnetrons when the required precision for the film thickness is not so high.

According to a seventh aspect of the present invention, the film thickness measuring instrument comprises a light emitter for radiating measuring light onto a substrate and a light receiver for receiving transmitted light or reflected light of the measuring light radiated onto the substrate to generate an electrical signal in response to a receiving amount of the transmitted light or the reflected light, wherein while the drum is rotated, whereby while the drum is rotated, the measuring light is radiated onto the substrate from the light emitter to measure the film thickness.

The film thickness measuring instrument according to this aspect measures indirect information on the film thickness, instead of measuring directly the film thickness. In other words, the film thickness measuring instrument comprises the light emitter and the light receiver, and the light receiver outputs the electrical signal in response to the receiving amount. Examples of the measuring light to be used are monochrome light having a wavelength of 550 num and monochrome light having a shorter wavelength of 549 num. The invention is applicable to not only a mode wherein monochrome measuring light is radiated from the light emitter but also a mode wherein white measuring light (measuring light not subjected to wavelength selection) is radiated from the light emitter, and the radiated light is converted into monochrome light on the receiving side.

According to an eighth aspect of the present invention, the electrical signal (light receiving signal) output from the light receiver is forwarded to a calculating means, and transmittance information or reflectance information is found based on the electrical signal by the calculating means. The calculating means may be included in the film thickness measuring instrument or in the controller as needed.

According to a ninth aspect of the present invention, the calculating means finds the transmittance information or the reflectance information in response to the incident angles based on signals indicating the receiving amount, which is obtained from the light receiver when incident angle of the measuring light is 0 deg and when the incident angle is in an angular range in the vicinity thereof, thereby to acquire data showing a relationship between the incident angle and transmittance or reflectance.

When the light emitter and the light receiver for film thickness measurement are fixedly located at certain positions, the incident angle of the measuring light is constantly changed in the carousal-type sputtering apparatus since the substrate holders are rotated. In order to cope with this problem, the dependency of the transmittance or the reflectance to the incident angle is found by computing the signals indicating the amount of received light at a position having the vertical incidence (incident angle of 0 dig) and at one or more positions in the angular range before and after the position having the vertical incidence.

By making use of a profile showing the relationship between the incident angle and the transmittance or the reflectance (curve showing changes in the transmittance or the reflectance to the incident angle) thus obtained, it is possible to reliably determine the completion of film deposition or the like. For example, it is possible to determine the completion of film deposition by using a technique wherein the computed profile is compared with an existing profile for a product having a targeted optical property, or changes in the form of the profile computed in real time are traced.

As another mode of the present invention, according to a tenth aspect of the present invention, the film thickness measuring instrument comprises a light emitter capable of selectively radiating a plural kinds of measuring light having different wavelengths onto the substrate, and a light receiver for receiving transmitted light or reflected light of the measuring light radiated onto the substrate to generate an electrical signal in response to a receiving amount of the transmitted light or the reflected light, whereby while the drum is rotated, the measuring light is radiated onto the substrate from the light emitter to measure the thickness. For example, measuring light having a wavelength of 550 nm and measuring light having a wavelength of 549 nm are used, being selectively exchanged.

According to an eleventh aspect of the present invention, the electrical signal (light receiving signals) output from the light receiver is forwarded to a calculating means to find transmittance information or reflectance information with respect to the plural kinds of measuring light having different wavelengths.

According to a twelfth aspect of the present invention, the calculating means finds transmittance or reflectance for the plural kinds of measuring light having different wavelengths, in response to incident angles based on signals obtained from the light receiver when incident angle of the measuring light is 0 deg and when the incident angle is in an angular range in the vicinity thereof, thereby to acquire data showing a relationship between the incident angle and transmittance or reflectance.

The present invention is applicable to a mode according to a thirteenth aspect of the present invention, wherein the calculating means makes approximate conversion based on data showing the relationship between the incident angle and the transmittance or the reflectance to find spectral transmittance or spectral reflectance.

It is possible to find spectral transmittance or spectral reflectance on a longer wavelength side than the wavelength of the measuring light by using a computing method wherein approximate values are obtained by converting angles into wavelengths based on the data for the transmittance or reflectance obtained in the certain angular range. It is possible to make measurement with further higher precision by using the plurality kinds of measuring light having different wavelengths to measure the transmittance or the reflectance.

In the sputtering apparatus according to the present invention, it is also preferable to adopt a mode which comprises a first measuring function wherein monochrome measuring light having a certain wavelength is used, the transmittance or reflectance for the measuring light corresponding to incident angles is found based on light receiving signals obtained from the light receiver when the incident angle of the measuring light is 0 deg and when the incident angle is in an angular range in the vicinity thereof, thereby to acquire data showing a relationship between the incident angle and the transmittance or reflectance and the data are converted into a graphical representation; a second function for finding the average of the data showing a relationship between the incident angle and the transmittance or reflectance acquired; a third function for making approximate conversion based on the data showing the relationship between the incident angle and the transmittance or the reflectance thus acquired to find spectral transmittance or spectral reflectance; and a fourth function wherein measuring light having a shorter wavelength than the certain wavelength is used, the transmittance or reflectance for the measuring light corresponding to incident angles is found based on light receiving signals obtained from the light receiver when the incident angle of the measuring light is 0 deg and when the incident angle is in an angular range in the vicinity thereof, thereby to acquire data showing a relationship of the transmittance or reflectance to the incident angle, and approximate conversion is made based on the data showing the relationship of the transmittance or the reflectance to the incident angle thus acquired to find spectral transmittance or spectral reflectance, and which is configured to be able to select one of the first to the fourth functions or a combination of at least two of the functions, depending on the steps in the film deposit process.

When an optical multilayer film is produced, the optical property of the film changes as the film deposition process proceeds. It is possible to improve the measuring precision and the precision in film thickness control by using measuring methods suited to the respective steps in the film deposition process.

According to a fourteenth aspect of the present invention, the film thickness measuring instrument is provided at a position far from the magnetron sputtering sources. The phrase "position far" means that "position, which is far, along the circumferential length on the outer wall, by a distance of 150 mm or longer, in particular 900 mm or longer in the horizontal direction when the intersection point of the centerline of the magnetron closest to the light-receiving unit (the line passing through the center of the magnetron and extending perpendicular to the target supporting surface) and the outer wall of the chamber is defined as the reference point. It is possible to make measurement with good precision since noise caused by plasma light can be reduced by locating the measuring position away from the film deposition spaces.

According to a fifteenth aspect of the present invention, it is possible to shut off the stray light of plasma from the film deposition spaces by additionally providing a light-shielding pipe (pipe having a light-shielding property) to encircle a light path where the transmitted light or the reflected light of the measuring light. In this case, it is preferable that the light-shielding pipe is electrically insulated from the chamber so as to be at a floating potential, which is proposed as a sixteenth aspect of the present invention. It is preferable that the light-shielding pipe has a leading edge provided with a reflection preventing member for reducing an adverse effect from the stray light caused by multiple reflection between the substrates and the leading edge which is proposed as a seventeenth aspect of the present invention.

By these arrangements, it is possible to significantly shut off the stray light of plasma from the film deposition spaces and to make measurement with good precision.

According to an eighteenth aspect of the present invention, there is provided a sputtering apparatus comprising AC magnetron sputtering sources, each having two adjacent targets provided thereon such that an anode/cathode relationship between the two targets is alternately changed by a frequency; magnetron sputtering sources with a target mounted on a single magnetron unit; and a controller, which makes such a control that rapid film deposition is performed by an AC magnetron sputtering source from start of film deposition, the film deposition by the AC magnetron sputtering source is stopped after the thickness of the film has achieved a value just smaller than a targeted film thickness, and then the rapid film deposition is changed to slow film deposition only by use of a magnetron sputtering source with a target mounted on a single magnetron unit to perform the film deposition up to achievement of the targeted film thickness.

The present invention can use the AC magnetron sputtering sources and the magnetron sputtering sources with a target mounted on a single magnetron unit to realize rapid film deposition and film thickness control with high precision. It is particularly preferable that the present invention is applied to a carousel-type sputtering apparatus.

As another mode of the present invention, according to a nineteenth aspect of the present invention, the target has a target surface inclined at such an inclination angle that when the target is located in a positional relationship to confront the substrate, the target surface is prevented from being parallel with a surface of the substrate.

The phrase "positional relationship to confront" means that the distance between the central point on the substrate supporting surface of a substrate holder and the central point on the magnetron confronting thereto is made to the minimum. In the case of each of the AC magnetron sputtering sources, the central point of the two targets adjacently provided (the central point in a case wherein the two targets are, as a whole, regarded as a single magnetron unit) is construed as the central point of the AC magnetron sputtering source.

The inclination angle is designed so as to have an optimum value, depending on the construction conditions of the sputtering apparatus with the targets mounted thereon. In other words, the target surfaces are inclined in an angular range capable to making the film thickness uniform. By using such inclination type targets, it is possible to make the film thickness uniform in the advancing direction of the substrates since the scattering direction of sputtered atoms are controlled and since conditions, such as a relationship of the distance and the angle between a rotating substrate and a target are adjusted. The present invention is also applicable to a mode wherein the inclination type targets are used together with conventional flat targets (normal targets) in a single carousel-type sputtering apparatus.

A twentieth aspect of the present invention provides a method invention corresponding to the apparatus invention according to the first aspect. Specifically, according to the twentieth aspect, there is provided a sputter film deposition method using a carousel-type sputtering apparatus which is configured so that a drum, which is formed in a polygonal or circular shape in transverse cross-section, is provided so as to be rotatable in a chamber, the drum having substrate holders provided on an outer peripheral surface; magnetron sputtering sources are provided inside a chamber wall; each of the magnetron sputtering sources comprises a target and a magnetron unit for holding the target; and the targets are held so as to be parallel with a rotary axis of the drum by the magnetron units; the method comprising measuring a thickness of a film deposited on a substrate mounted on a substrate holder during film deposition; and controlling parameters affecting on an amount of film deposition, based on measurement results obtained by the film thickness measuring step.

A twenty-first aspect of the present invention provides a method invention corresponding to the apparatus invention according to the eighteenth aspect. Specifically, according to the twenty-first aspect, there is provided a sputter film deposition method using a sputtering apparatus which comprises AC magnetron sputtering sources, each having two adjacent targets provided thereon such that an anode/cathode relationship between the two targets is alternately changed by a frequency, and magnetron sputtering sources with a target mounted on a single magnetron unit; the method comprising performing rapid film deposition by use of an AC magnetron sputtering source from start of film deposition, stopping the film deposition by the AC magnetron sputtering source after the thickness of the film has achieved a value just smaller than a targeted film thickness, and then changing the rapid film deposition to slow film deposition only by use of a magnetron sputtering source with a target mounted on a single magnetron unit to perform the film deposition up to achievement of the targeted film thickness.

In a mode of this case, it is preferable to measure a film thickness during film deposition and to control parameters affecting on an amount of film deposition based on measurement results obtained by the film thickness measurement, which is proposed as a twenty-second aspect of the present invention.

Twenty-third to thirty-second aspects of the present invention provide a method invention corresponding to the apparatus invention according to the fifth and seventh to fifteenth aspects. A thirty-third aspect of the present invention provides a method invention corresponding to the apparatus invention according to the nineteenth aspect.

BRIEF DESCRIPTION OF THE DRAWINGS

FIG. 8 is a table showing typical examples of the target material and the film material, which are mainly used in the present invention;

FIG. 9 is a table showing typical examples of the substrates, which are mainly used in the present invention;

FIG. 12 is a block diagram showing the detailed structure of a film monitoring system using a variable wavelength laser;

FIGS. 14(a) and (b) are a cross-sectional view of the target according to an embodiment of the present invention and a plan view of the target;

FIGS. 17(a) to (d) are schematic view showing an inclination-type targets, which are applicable to each of the sputtering sources for rapid film deposition;

FIGS. 19(a) to (d) are schematic views showing another example of the structure of the inclination-type targets applied to each of the sputtering source for rapid film deposition;

FIG. 34 is a table listing examples of the film structure and film deposition methods;

FIG. 36 is a table showing the evaluation results for the properties of multilayer film; and FIG. 37 is a table showing a list of targeted values with respect to the film properties required for multilayer optical films.

Figure 1:
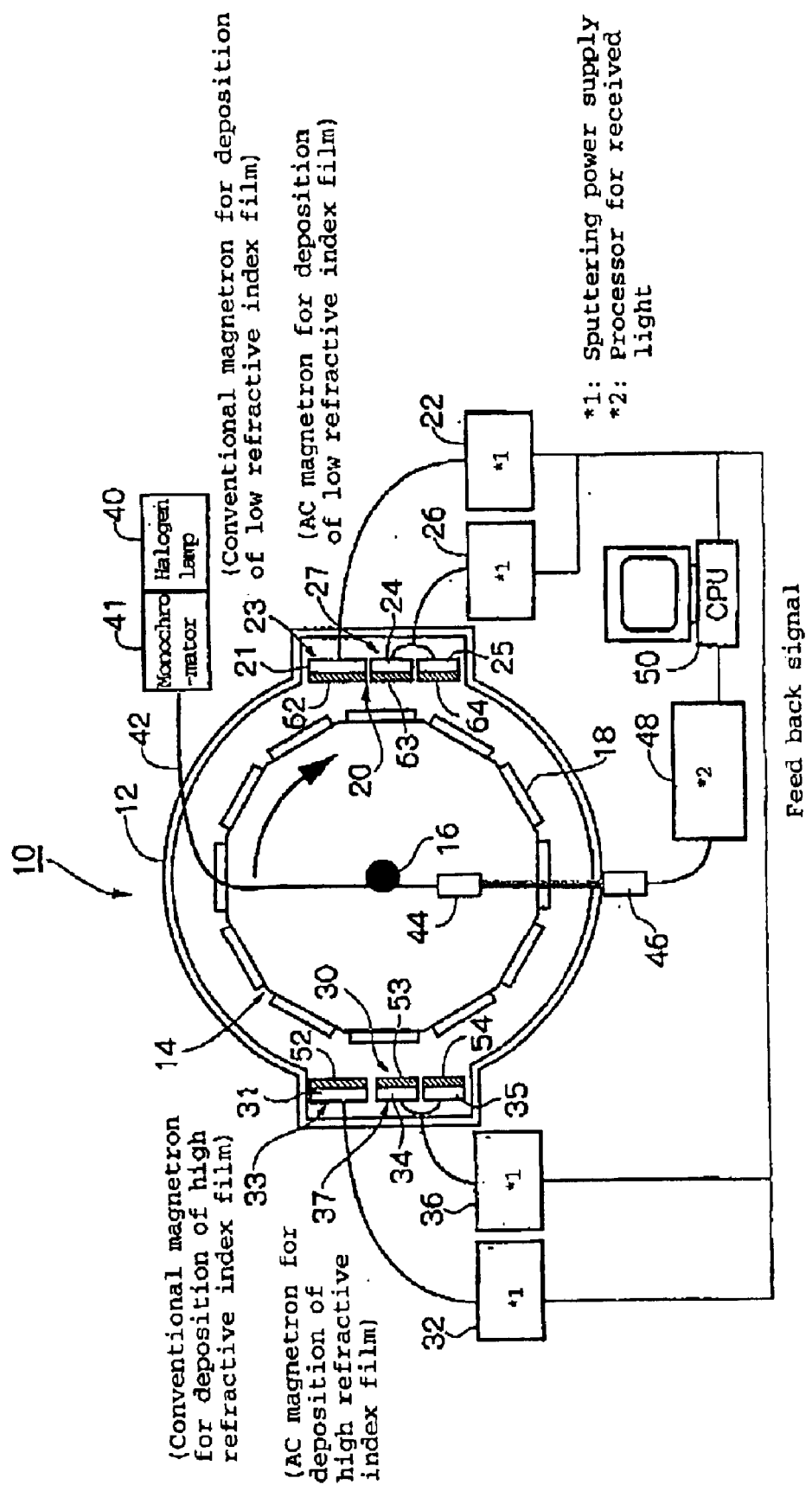
FIG. 1 is a schematic plan view showing the structure of the sputtering apparatus for depositing a multilayer optical film, according to an embodiment of the present invention.

EXPLANATION OF REFERENCE NUMERALS 10 sputtering apparatus, 12 chamber. 14 substrate holder, 14A measuring opening, 16 central shaft (rotary shaft), 17 drum, 18 substrate, 18A and 18B substrate to be monitored, 20 magnetron sputtering source (magnetron sputtering source for deposition of a low refractive index film), 21 magnetron unit, 22 power supply, 23 conventional magnetron, 23A center line, 24 and 25 magnetron unit, 26 AC power supply, 27 AC magnetron, 27A center line, 30 magnetron sputtering source (magnetron sputtering source for deposition of a high refractive index film), 31 magnetron unit, 32 power supply, 33 conventional magnetron, 33A center line, 34 and 35 magnetron unit, 36 AC power supply, 37 AC magnetron, 37A center line, 40 halogen lamp, 41 monochromator, 42 optical fiber, 44 Light-emitting head (film thickness measuring instrument), 46 light-receiving head (film thickness measuring instrument), 48 processor for received light, 49 control amplifier, 50 personal computer (controller, calculating means), 51 CPU (controller, calculating means), 52, 53 and 54 Ti target, 62, 63 and 64 Si target, 70 sputtering apparatus, 72, 74, 76 and 78 shutter, 80 deposition-prevention plate, 82 head of reflective monitor, 84 chopper, 85 photomultiplier instrument, 86 lamp power supply, 87 light divider, 88 photodiode, 90 valuable wavelength laser, 92 target, 92A and 92B target inclined surface, 92C ridge, 94, 95, 96 and 97 target, 96A, 96B, 97A and 97B inclined surface, 100 sputtering apparatus, 120 light-shielding pipe, 122 stage, 124 supporting pipe, 126 dielectric plate, 128 insulation bush, 130 light-shielding lid, 131 hole, 140 film deposition apparatus, 142 magnetron control console, 151 and 152 Ta target, 161 and 162 Si target, 200 chamber, 202 substrate holder, 204 substrate, 206 magnetron sputtering source for deposition of a low refractive index film, 208 magnetron sputtering source for deposition of a high refractive index film, 210 and 212 target, 214 central shaft, 216 and 218 sputtering source.

BEST MODE FOR CARRYING OUT THE INVENTION

Now, preferred embodiments of the sputtering apparatus and the sputter film deposition method according to the present invention will be described, referring to the accompanying drawings.

Figure 2:
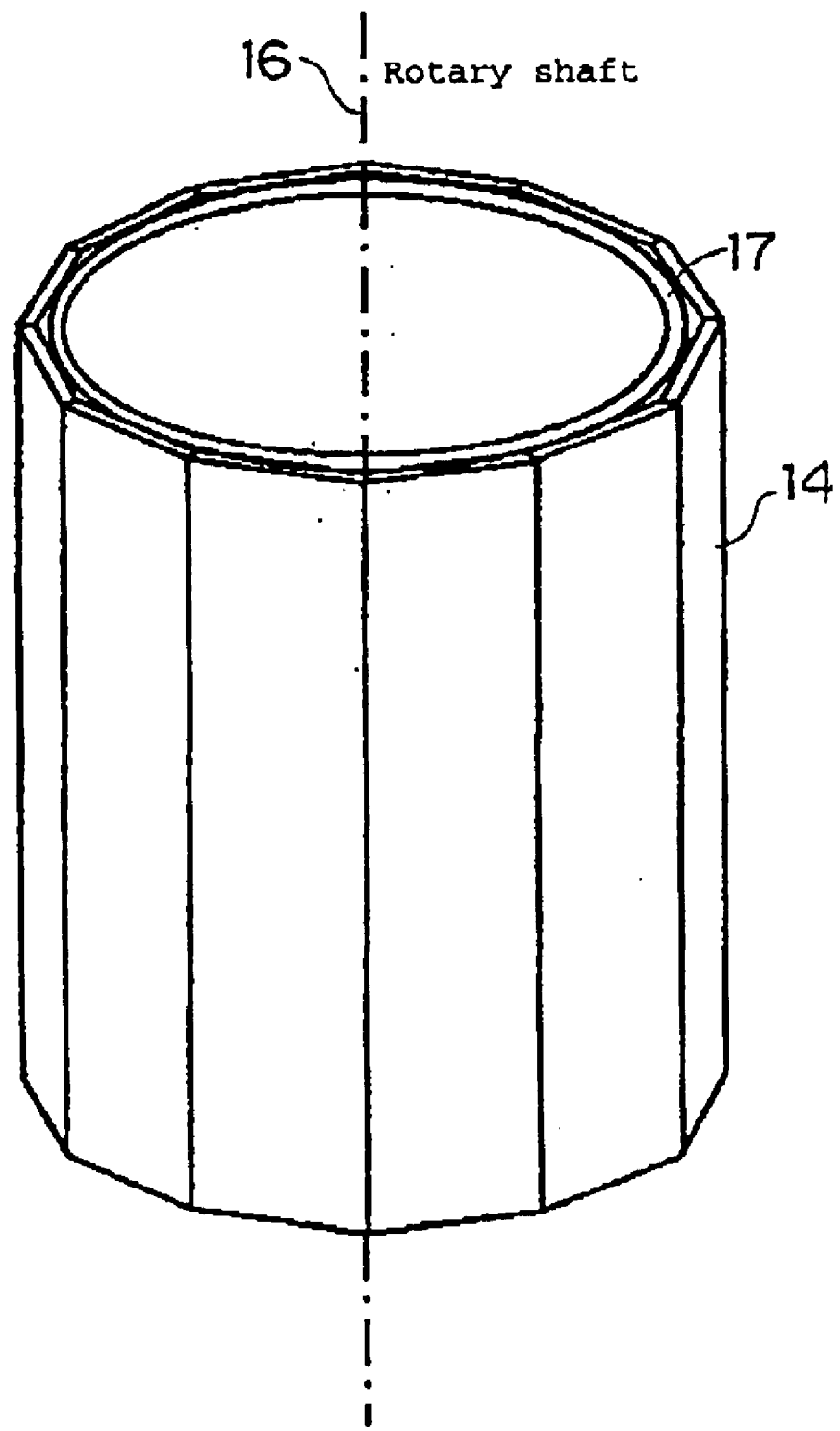
FIG. 2 is a perspective view of substrate holders used in the apparatus shown in FIG. 1.

FIG. 1 is a schematic plan view showing the structure of the sputtering apparatus for depositing a multilayer optical film, according to an embodiment of the present invention, and FIG. 2 is a perspective view of substrate holders used in the apparatus. The sputtering apparatus 10 shown in FIG. 1 is a carousel type sputtering apparatus, which is configured to include a drum (not shown in FIG. 1 and indicated by reference numeral 17 in FIG. 2) and the substrate holders 14 provided on an outer peripheral surface of the drum 17 in a cylindrical chamber 12 having a height of 1.5 m and a diameter of 1.5 m, wherein the substrate holders 14 are combined in a regular dodecagonal shape having a diameter of 1 m and are supported so as to be rotatable about a central shaft 16 as the center of rotation.

The chamber 12 as a reaction chamber is connected to evacuating pumps, not shown, to obtain therein a low pressure required for sputtering. The chamber 12 is provided with a gas supplying port for introducing a gas required for sputtering and a loading door, which are not shown. The chamber 12 has an inner wall (inner peripheral surface) formed in a shape facing the drum 17 so as to be apart from the drum by a certain distance.

As shown in FIG. 2, the substrate holders 14 are mounted on the outer peripheral surface of the cylindrical drum 17 and are rotated integrally with the drum 17, which is provided so as to be rotatable. The drum 17 may be formed in, e.g., a polygonal tubular shape (tubular shape being polygonal in transverse section), instead of being formed in a cylindrical shape.

As shown in FIG. 1, the substrate holders 14 have substrates for film deposition (e.g., glass substrates) 18 provided thereon and are rotated at a constant rotational speed (e.g., 6 rpm) by rotation of the drum, which is caused by a rotary unit, not shown. The chamber 12 includes a magnetron sputtering source for deposition of low refractive index films 20 and a magnetron sputtering source for deposition of high refractive index films 30 therein. The magnetron sputtering sources 20, 30 are rectangular magnetron sputtering sources, which have a length of 1.2 m in a vertical direction and deposit a film on the substrates 18 passing in front thereof.

The magnetron sputtering source 20 is configured by combining a conventional magnetron sputtering source (hereinbelow, referred to as the conventional magnetron) 23, which includes a single magnetron unit 21 connected to a power supply (a DC power supply for supplying a rectangular power pulse in this embodiment) 22, and an alternating magnetron sputtering source (hereinbelow, referred to as the AC magnetron) 27, which includes two magnetron units 24, 25 connected to a single alternating power supply 26 and alternately changes an anode/cathode relationship by a certain frequency.

Likewise, the magnetron sputtering source 30 is configured by combining a conventional magnetron 33, which includes a single magnetron unit 31 connected to a power supply 32, and an AC magnetron 37, which includes two magnetron units 34, 35 connected to a single power supply 36.

The operational principle of the AC magnetrons 27, 37 is disclosed in JP-A-5-222530, JP-A-5-222531, JP-A-6-212421 and JP-A-10-130830. To sum up, the AC magnetrons are magnetrons, each of which includes two targets provided side by side so that when one of the targets serves as a cathode, the other target serves as an anode, and that the cathode and the anode are interchanged by a frequency of tens of kHz. The AC magnetrons can stably and rapidly deposit a film, such as an oxide film or a nitride film, under several kinds of controls.

The conventional magnetrons 23, 33 are advantageous in that they can control a film thickness with good precision, though the conventional magnetrons have a lower film deposition rate than the AC magnetrons 27, 37. The sputtering apparatus 10 shown in FIG. 1 can realize both rapid film deposition and film thickness control with high precision by using a combination of the AC magnetrons 27, 37, which can deposit a film rapidly, and the conventional magnetrons 23, 33.

Figure 28:
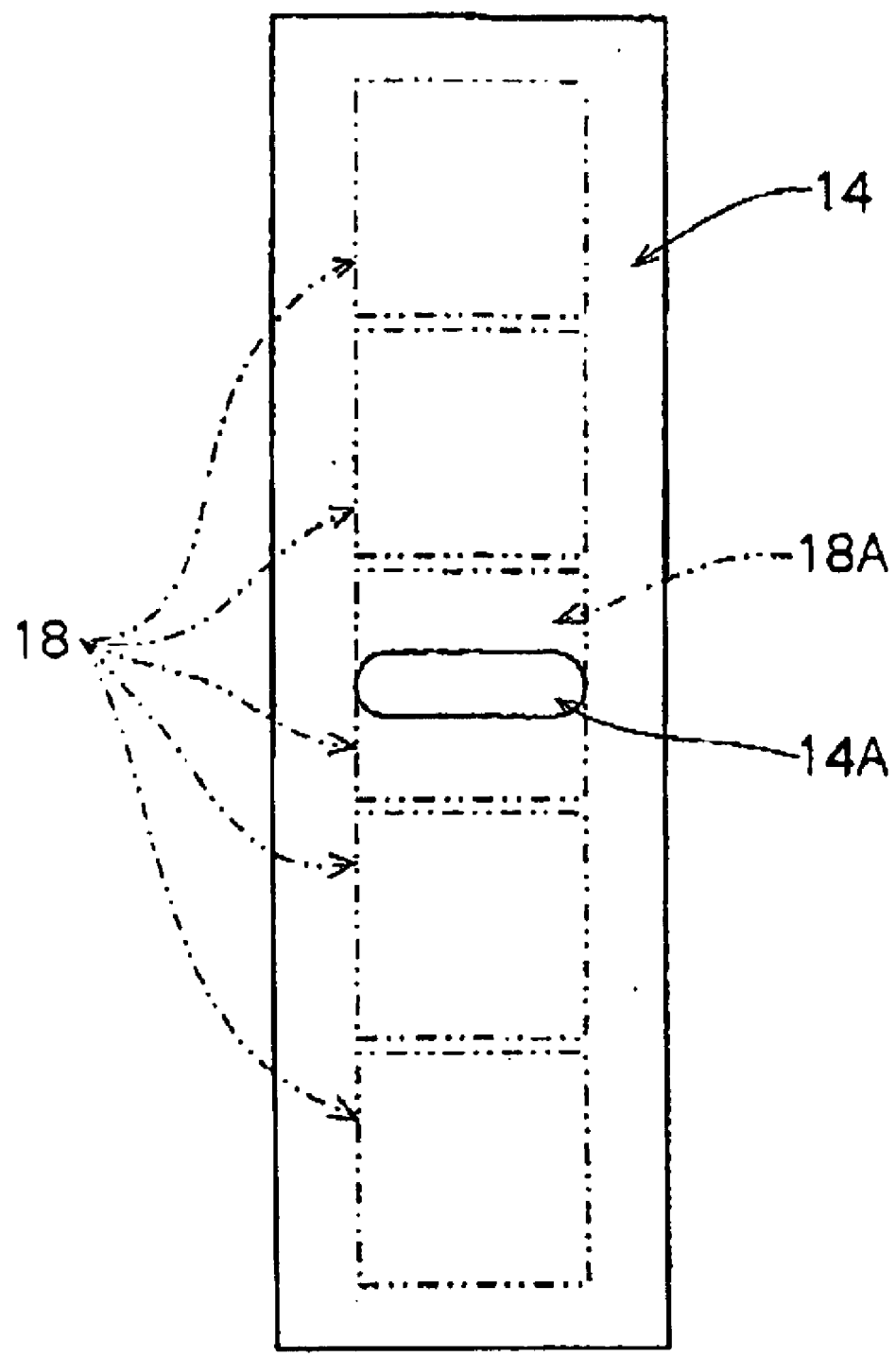
FIG. 28 is a plan view of a substrate holder.
Figure 29:
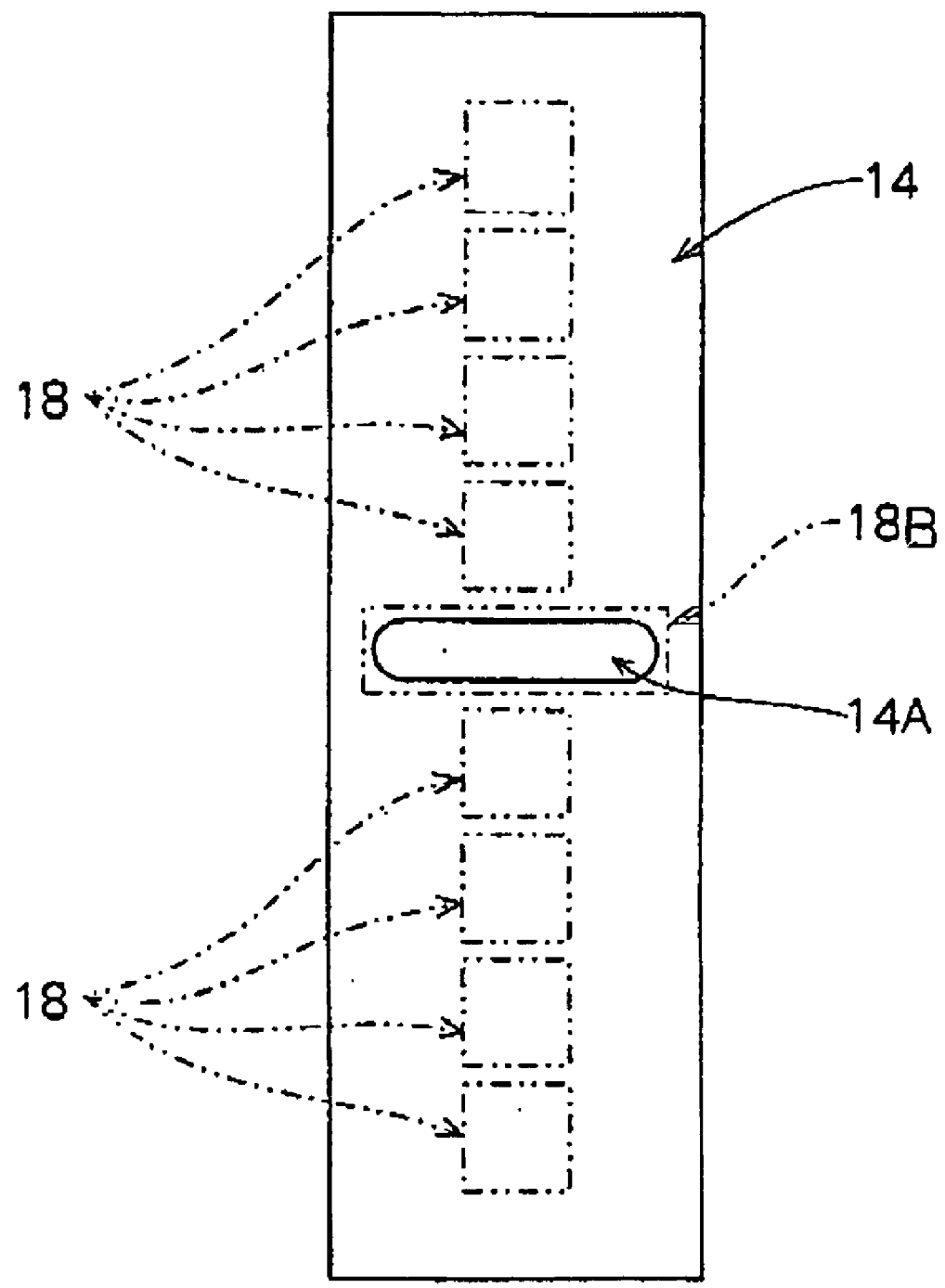
FIG. 29 is a plan view showing another mode of the substrate holder.

The sputtering apparatus 10 includes, as a measuring instrument (film thickness monitoring system), a halogen lamp 40, a monochromator 41, an optical fiber 42, a light-emitting head 44, a light-receiving head 46 and a processor for received light 48. The light from the halogen lamp 40 is subjected to wavelength selection by the monochromator 41 and is guided to the light-emitting head 44 through the optical fiber 42. The light-emitting head 44 is provided inside the substrate holders 14 (inside the drum 17), and the light-emitting head 44 emits light toward the substrates 18 in rotation. As shown in FIG. 28, each of the substrate holders 14 has a light-passing opening (measuring opening) 14A formed in a central portion in a vertical direction so as to be elongated in the direction of rotation. The measuring opening 14A has a length in the vertical direction set to substantially the same as the spot diameter of the emitted light (30 mm in this embodiment), and the light is irradiated onto a substrate to be monitored 18A through its corresponding measuring opening 14A. The greater the width of the measuring opening 14A in a longitudinal direction is, the wider the incident angular range can become. As shown in FIG. 29, a substrate to be monitored 18B may be mounted over a measuring opening 14A to measure the film thickness.

The light-receiving head 46 is provided outside the chamber 12 shown in FIG. 1, and the chamber 12 has a shell formed with a window for directing light (not, shown) to the light-receiving head 46. The light that has passed through a substrate 18 is received by the light-receiving head 46, and the received light is forwarded to the processor for received light 48 after having been transformed into an electrical signal in response to the amount of the received light. The processor for received light 48 subjects the received signal to signal processing to transform the received signal into computer-acceptable measured data. The measured data transformed in the processor for received light 48 are forwarded to a personal computer (hereinbelow, referred as to the PC) 50.

The PC 50 includes a central processing unit (CPU), serves as not only a processing unit but also a control unit to control the respective sputtering power supplys (22, 26, 32, 36) based on the measured data received from the processor for received light 48. The PC 50 may control the turning on and off of the halogen lamp 40, the rotation of the substrate holders 14, the pressure in the chamber 12, the supply of the introduced gases, the opening and closing of shutters (not shown in FIG. 1 but indicated by reference numerals 72, 74, 76 and 78 in FIG. 5) and another member. The PC 50 has programs required for the respective controls and several sorts of data stored therein.

Although the halogen lamp 40 and the monochromator 41 are used as the light source unit of the optical measuring instrument for measuring a film thickness in the embodiment shown in FIG. 1, the light source unit of the optical measuring instrument used in the film thickness monitoring system is not limited to the arrangement shown in FIG. 1. Any proper light source may be selected in accordance with an object to be measured. For example, a tunable laser (variable wavelength laser) having wavelengths of 1460 to 1580 nm is used for production of a WDM filter. The measurement is not limited to a mode to use monochromatic measuring light. The measurement may be performed in a mode to use white measuring light and change it into monochromatic light on the light receiving side. The mode to perform the change on the light receiving side is more advantageous than the mode to use monochromatic measuring light in that noise is reduced.

The operation of the sputtering apparatus 10 configured as stated earlier will be explained. The Example stated below is a case wherein films of $SiO_2$ as low refractive index films and films of $TiO_2$ as high refractive index films were formed by reactive sputter deposition.

First, Ti targets 52, 53 and 54 are, respectively, mounted on the respective magnetron units 31, 34 and 35 in the magnetron sputtering source 30 for deposition of a high refractive index film, and Si targets 62, 63 and 64 were, respectively, mounted on the respective magnetron units 21, 24 and 25 in the magnetron sputtering source 20 for deposition of a low refractive index film. The respective targets had dimensions of 1.1 m in height and 15 cm in width for the conventional magnetrons and dimensions of 1.1 m in height and 10 cm in width for the AC magnetrons, respectively.

Additionally, nine glass substrates 18, which had a thickness 1.1 mm and an area of 10 cm square, were mounted on each of the substrate holders 14 side by side in a vertical direction. The chamber was sucked to 5 Pa by a rotary pump and then was evacuated to $1\times10^{-3}$ Pa by a cryopump.

Next, 100 sccm of argon gas and 30 sccm of oxygen gas were introduced into the chamber 12 through a mass flow controller. The gas pressure at that time was 0.4 Pa. The unit "sccm" means the flow rate ($cm^3$/min) under a standard condition (0° C., 1 atmosphere).

In order to deposit a $SiO_2$ film, 10 kW of d.c. power pulse in a rectangular form and 20 kW of a.c. power were applied to the conventional magnetron 23 with the Si target 62 mounted thereon and the AC magnetron 27 with the Si targets 63, 64 mounted thereon, respectively, to conduct preliminary discharge for 5 min with both shutters (not shown in FIG. 1) between the targets and the substrates being closed. And then, both shutters were opened to perform the film deposition.

Figure 3:
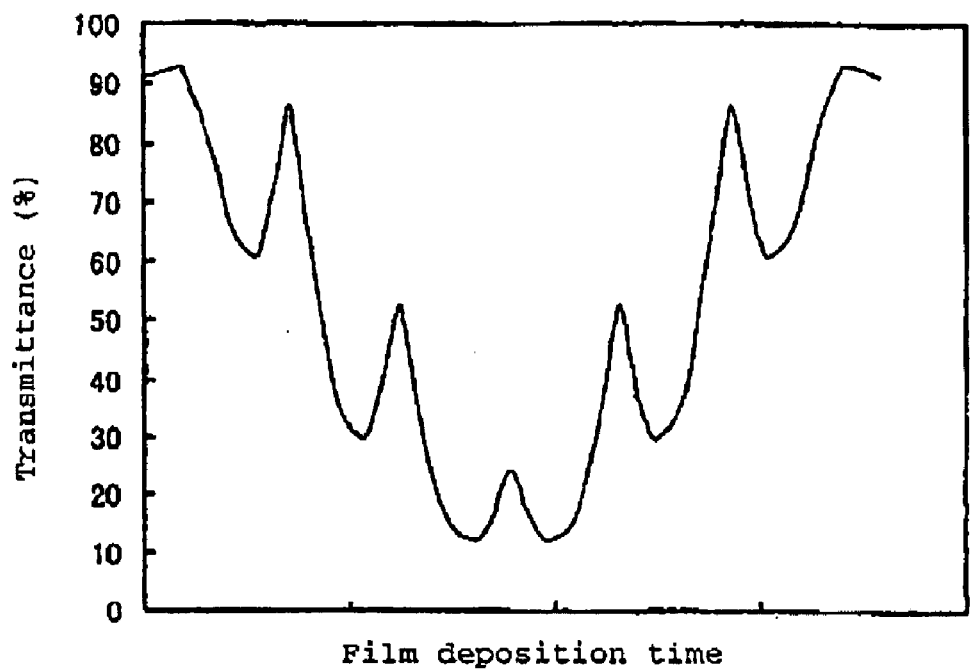
FIG. 3 is a graphical representation showing a typical example of signals from the film thickness monitoring system in an Example.

During film deposition, the film thickness monitoring system stated earlier measured the transmittance of the substrates 18 on the substrate holders 14. Since the transmittance of the substrates 18 changes in accordance with the film thickness of a deposited film, the film thickness can be grasped by monitoring the transmittance. For reference, FIG. 3 shows a typical example of signals from the film thickness monitoring system in the Example.

The film deposition was conducted while the film thickness was being monitored by the film thickness monitoring system. At the moment when the film was grown to have the thickness equal to 90% of a desired value, the power supply to the AC magnetron 27 was stopped, and the film deposition was continued only by the conventional magnetron 23. During film deposition, the measured results on the transmittance were calculated by the PC 50, and information on the measured results was fed back to the respective sputtering power supplys 26, 22 not only to improve the uniformity in the deposited film with respect to the rotational direction of the substrates 18 but also to controllably bring the film thickness to the desired value. The rotational speed of the substrate holders 14 or the opening degree (opening amount) of the shutters may be adjusted to control the film deposition.

Next, in order to deposit a $TiO_2$ film, 15 kW of a.c. power and 30 kW of a.c. power were applied to the conventional magnetron 33 with the Ti target 52 mounted thereon and the AC magnetron 37 with the Ti targets 53, 54 mounted thereon, respectively, to conduct preliminary discharge for 5 min as in the film deposition step for the $SiO_2$ film. And then, both shutters were opened to perform the film deposition. In the case of the $TiO_2$ film as well, at the moment when the film was grown to have the thickness equal to 90% of a desired value, the power supply to the AC magnetron 37 was stopped, and the film deposition was continued only by the conventional magnetron 33. The film deposition step was the same as the $SiO_2$ film in terms of feeding back the measured results of the transmittance to the respective sputtering power supplys 36, 32 to improve the uniformity in the deposited film with respect to the rotational direction of the substrates 18 and to control the film thickness accurately.

The step to deposit a $SiO_2$ film and the step to deposit a $TiO_2$ film stated earlier were repeated to produce a bandpass filer having 13 layers of glass (substrate)/$SiO_2$ (94.2 nm)/ $TiO_2$ (57.3 nm)/$SiO_2$ (94.2 nm)/$TiO_2$ (57.3 nm)/$SiO_2$ (94.2 nm)/$TiO_2$ (57.3 nm)/$SiO_2$ (188.2 nm)/$TiO_2$ (57.3 nm)/$SiO_2$ (94.2 nm)/$TiO_2$ (57.3 nm)/$SiO_2$ (94.2 nm)/$TiO_2$ (57.3 nm)/ $SiO_2$ (94.2 nm). Such a film structure will be represented as glass/$(SiO_2$ 94.2/$TiO_2$ 57.3 nm$)^3$/$SiO_2$ 188.2 nm/$(TiO_2$ 57.3 nm/$SiO_2$ 94.2 mm$)^3$.

Figure 4:
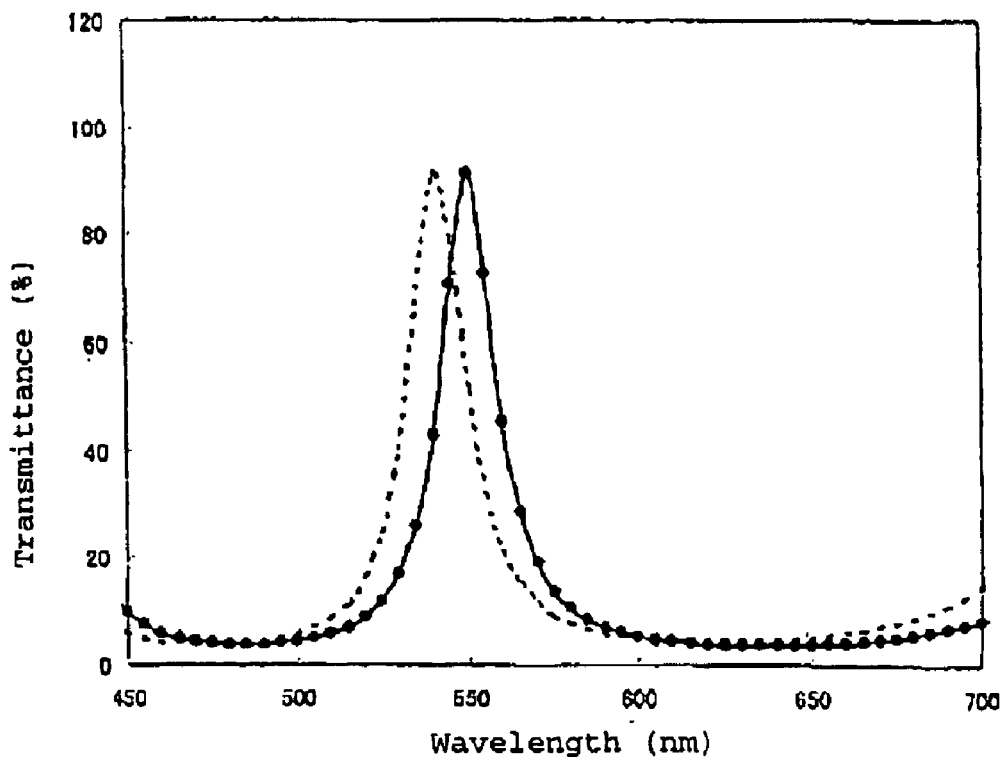
FIG. 4 is a graphical representation showing the spectral characteristics of the bandpass filter produced in the Example.
Figure 27:
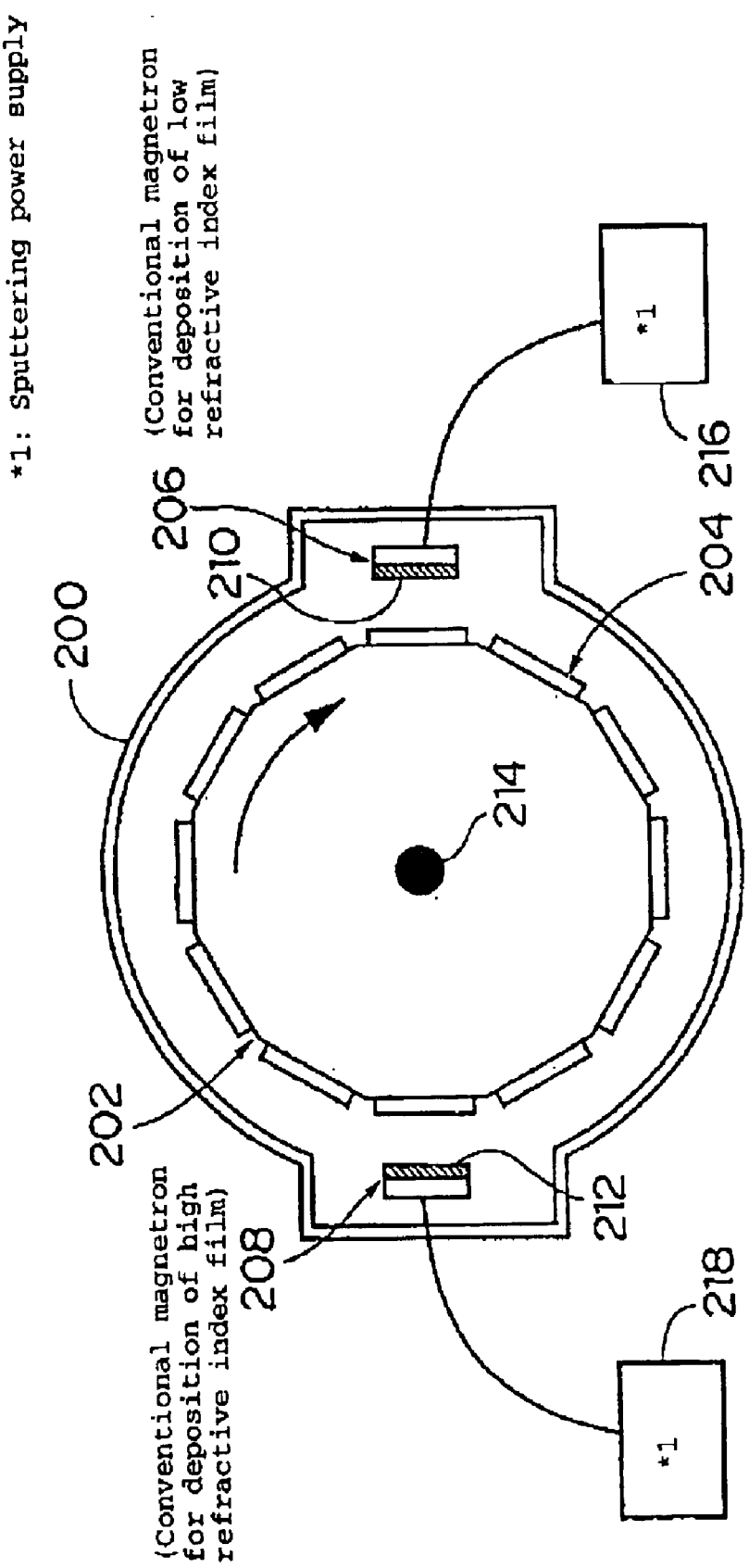
FIG. 27 is a schematic view showing the structure of a conventional sputtering apparatus for depositing a multilayer optical film.

The spectral characteristics of the bandpass filter thus produced are shown in FIG. 4. In this figure, solid black circles designate designed values, and a solid line indicates the measured results of the spectral characteristics of the bandpass filter produced in this Example. A dotted line indicates the measured results of the spectral characteristics of a bandpass filter, which was produced, for comparison, by using a sputtering apparatus having neither AC magnetrons nor feedback system to power supplies as shown in FIG. 27 unlike the embodiment. According to FIG. 4, the bandpass filter produced according to the present invention shows substantially the same spectral characteristics as the designed values. However, in the case of the bandpass filter produced without using a feedback system to power supplies, the transmittance had a peak value at a wavelength different from the designed wavelength for the bandpass filter (550 nm).

By using the sputtering apparatus 10 according to this embodiment, it is possible to produce WDM filters or dichroic mirrors with good productivity since it becomes possible to rapidly deposit a multilayer film on each of the substrates 18 and to control film thicknesses with high precision.

In the Example stated above, each of the films was produced by simultaneously energizing the relevant AC magnetron and the relevant conventional magnetron until obtaining the film thickness equal to 90% of the designed film thickness, followed by energizing only the relevant conventional magnetron with the relevant AC magnetron deenergized. The control method is not limited to the method in this Example. For example, there may be adopted a control method wherein each of the films is produced by performing the film deposition only by the relevant AC magnetron until obtaining the film thickness equal to 90% of the designed film thickness, followed by energizing only the relevant conventional magnetron. The timing when the relevant AC magnetron is deenergized is not limited to the moment when each of the film thicknesses has achieved a value equal to 90% of the relevant designed film thickness, and the timing may be set appropriately.

In the Example, the film thickness control was performed with the thicknesses of each of the films being monitored even during energization to the relevant AC magnetron (within a period of achieving the value equal to 90% of the relevant designed film thickness). During energization to the relevant AC magnetron, there may be adopted a control method wherein the relevant film thickness is monitored without performing the film thickness control, time management is performed based on a predicted value of the thicknesses of each of the films, which is obtained from the supplied power and the sputtering time period according to the relationship previously found, and the relevant AC magnetron is deenergized when a certain period of time has passed. In this modified method, the film thickness control (e.g., a feedback control to the relevant power supply) may be started when the film deposition only by the relevant conventional magnetron is started.

The position on each of the substrates 18 where the film thickness measurement is performed (measuring point) may be a single point on a central portion of each of the substrates 18. Or, the measurement may be performed at a plurality of points in a transverse direction along the rotational direction (hereinbelow, also referred as to the advancing direction) to find a film thickness distribution in the transverse direction. The measurement may be performed by providing a plurality of film thickness measuring instruments (each comprising a light-emitting head 44 and a light receiving head 46) in the vertical direction along the rotational shaft of the substrate holders 14 and finding the film thickness at a plurality of points in the vertical direction.

During film deposition, the substrate holders 14 are constantly rotated, and the transmittance is measured by checking one sample or more per one revolution of the substrate holders 14 (more preferably one sample for each of the sides of the dodecagonal shape, totally twelve samples). For example, the rotary unit includes a rotational position sensor for generating one signal per one revolution and a substrate position sensor for generating a signal whenever the substrate mounting surface of each of the substrate holders 14 passes a certain position fixed in the circumferential direction, and the measurement is performed for each of the samples by utilizing the signals from the position sensors as triggers.

Even when the position sensors are eliminated, the transmittance can be measured based on cyclic signals, which can be obtained by continuous measurement. However, the use of the position sensors can perform the measurement more accurately since the relationship between a measuring point and the relevant measured signal can be definitely grasped.

The data stream of the transmittance that is obtained with the substrates being rotated includes data with the transmittance of the films showing an angular dependence. Theoretically, the data stream includes values, which are symmetrical about the transmittance for measuring light having an incident angle of 0 deg. By utilizing this symmetry, the angular dependence can be approximately transformed into spectral characteristics based on the transmittance for measuring light having an incident angle of 0 deg. The method for the approximate transformation will be described later in detail, referring to FIGS. 21 to 26.

Although the sputtering apparatus 10 shown in FIG. 1 has the light-emitting head 44 provided inside the substrate holders 14 and the light receiving head 46 provided outside the chamber 12, the light-emitting head 44 and the light receiving head 46 may be interchanged.

Now, modifications of the embodiment stated earlier will be described.

Figure 5:
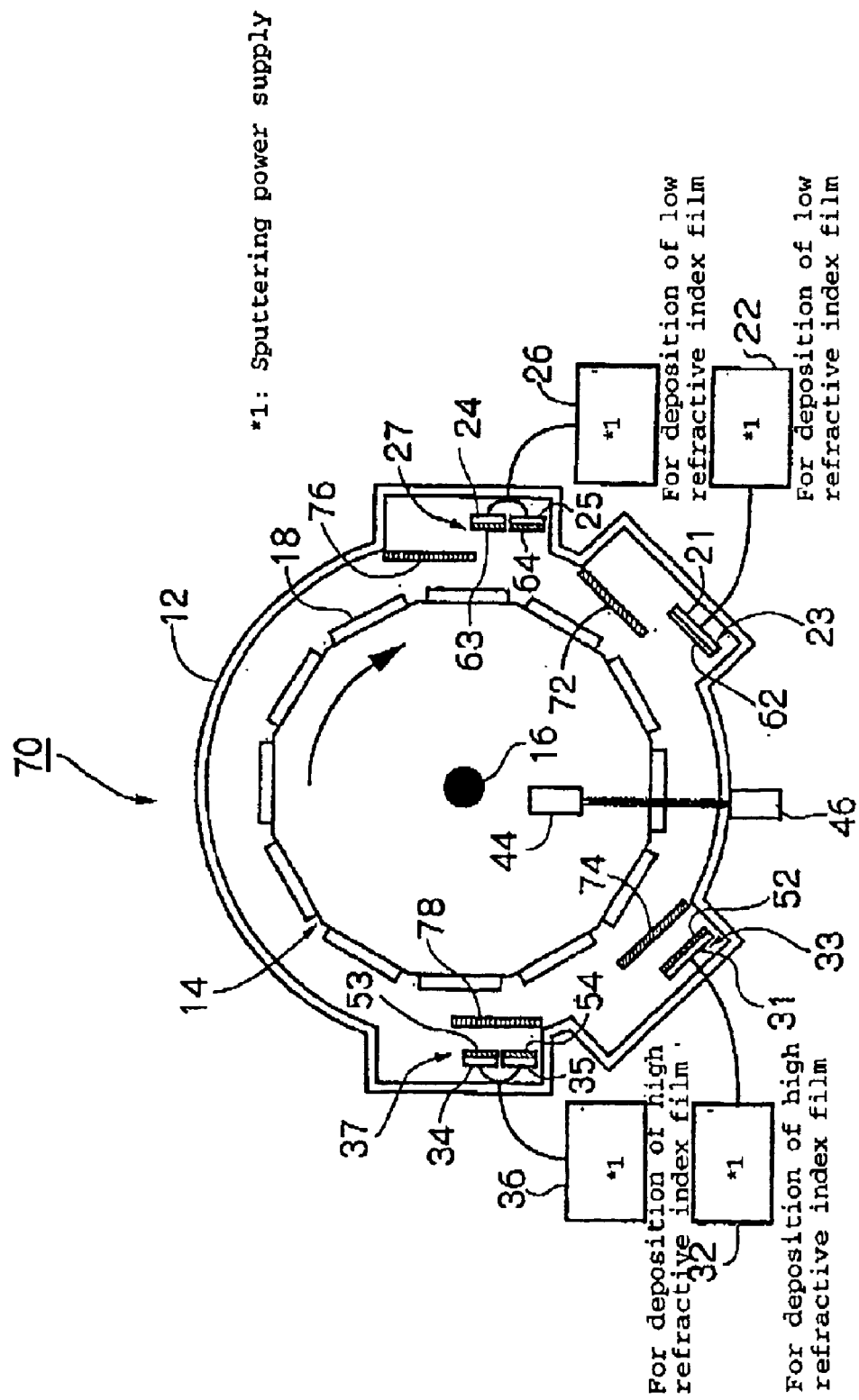
FIG. 5 is a schematic view of the sputtering apparatus for depositing a multilayer optical film according to another embodiment of the present invention.

FIG. 5 is a schematic view of the sputtering apparatus for depositing a multilayer optical film 70 according to another embodiment. In FIG. 5, members corresponding to those in the embodiment shown in FIG. 1 are indicated by the same reference numerals as the embodiment shown in FIG. 1, and explanation of the members will be omitted. In FIG. 5, some members, such as the halogen lamp 40, the monochromator 41, the optical fiber 42, the processor for received light 48 and the PC 50, are not shown for simplification (which is also applicable to FIG. 6 and FIG. 7(d)).

In the sputtering apparatus 70 shown in FIG. 5, the magnetron sputtering sources for deposition of a low refractive index film and the magnetron sputtering sources for deposition of a high refractive index film have the conventional magnetrons 23, 33 and the AC magnetrons 27, 37 provided in different positions. Shutters 72, 74, 76, 78 are provided between the respective magnetrons (23, 33, 27, 37) and the substrates so as to be controllably opened and closed. In this figure, there is shown a state wherein a low refractive index film is being deposited. In this state, the shutters 72, 76, which are provided in front of the conventional magnetron 23 and the AC magnetron 27 for deposition of a low refractive index film, are opened, and the shutters 74, 78, which are provided in front of the conventional magnetron 33 and the AC magnetron 37 for deposition of a high refractive index film, are closed.

Referring to this figure, the deposition reaction can be ensured to be stopped by closing the shutters 72, 76 at the moment when a desired film thickness has been obtained by reactive sputter deposition, and the targets can be prevented from being deteriorated by closing the shutters 74, 78 of the sputtering sources that are not used for film deposition at this time. When the deposition of a low refractive index film has been completed, the shutters 74, 78 are opened to perform the deposition of a high refractive index film.

Figure 6:
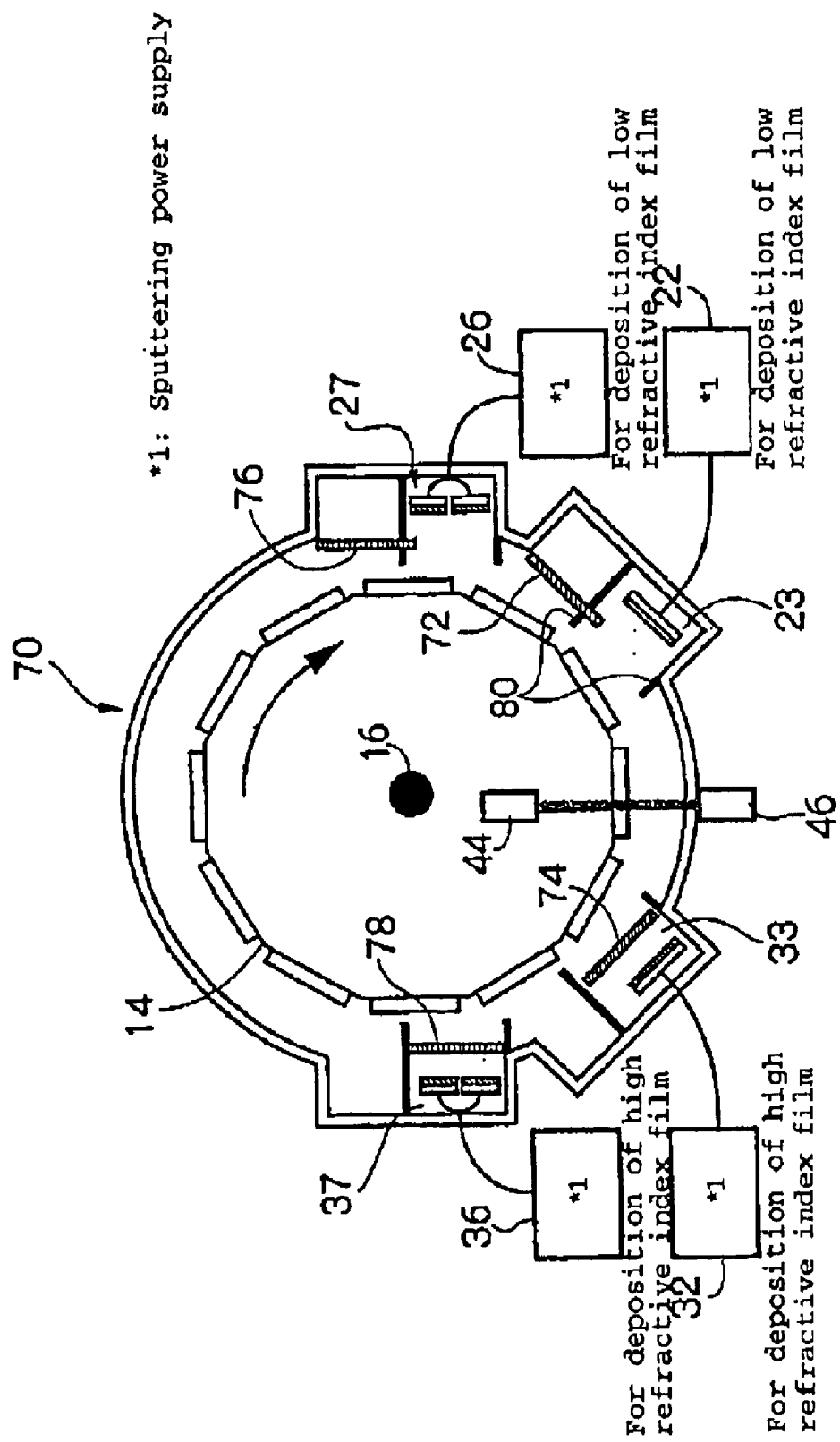
FIG. 6 is a schematic view showing a case wherein the sputtering apparatus shown in FIG. 5 has deposition-prevention plates additionally provided thereon.
Figure 7A:
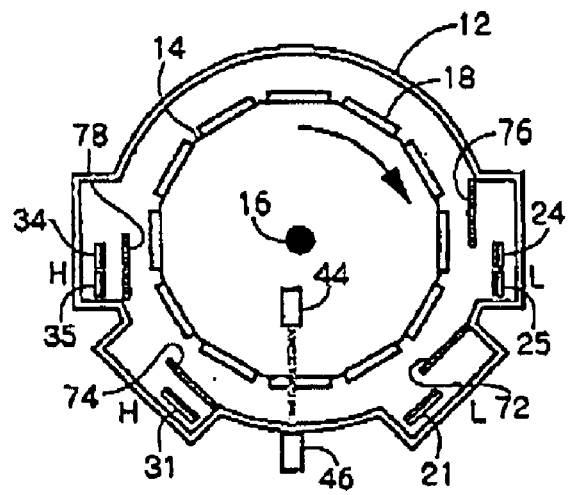
FIGS. 7(a) to (d) are schematic views showing variations in the arrangement of cathodes.
Figure 7B:
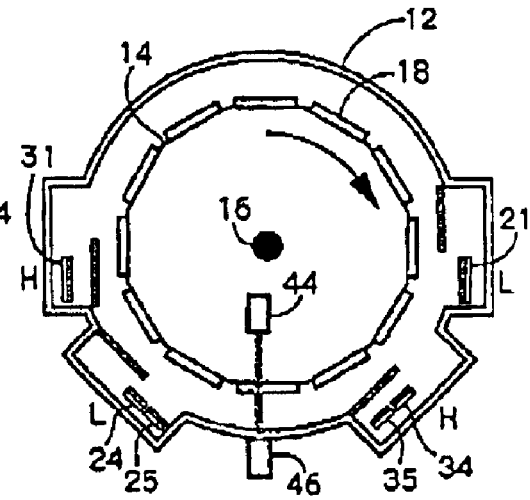
Figure 7C:
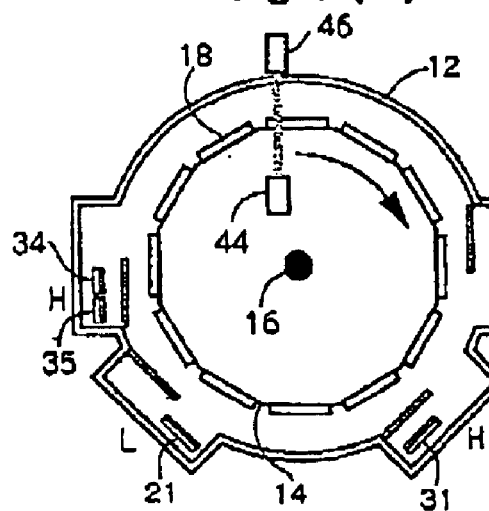
Figure 7D:
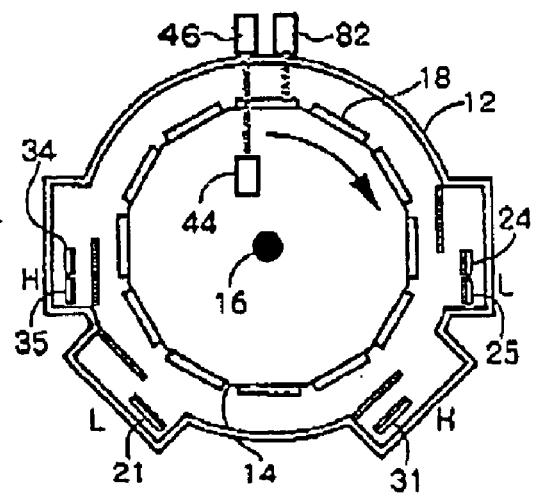

It is a preferable mode that each of the magnetrons (23, 33, 27, 37) has deposition-preventing plates 80 provided on both right and left lateral sides as shown in FIG. 6. The deposition-preventing plates 80 serve to prevent plasma from spreading so as to limit film deposition to the substrates 18 right in front of the magnetrons, and to prevent the film deposition from being performed on the other substrates (substrates adjacent to the substrates right in front of the magnetrons). Since the right and left sides of each of the magnetron sputtering sources are respectively partitioned by the deposition-preventing plates 80, each of the magnetron sputtering sources can prevent impurities from depositing on its targeted substrate without being affected by the other magnetron sputtering sources.

FIGS. 7(*a*) to 7(*d*) shows variations in the arrangement of the cathodes. The present invention may be carried out in several modes with respect to the arrangement of the cathodes as shown in FIGS. 7(*a*) to 7(*d*). In these figures, symbol "H" indicates the cathodes (magnetron units) for deposition of a high refractive index film, and symbol "L" indicates the cathodes (magnetron units) for deposition of a low refractive index film. FIG. 7(*a*) shows a case wherein the cathodes for deposition of a high refractive index film are separated from the cathodes (magnetron units) for deposition of a low refractive index film, to which explanation of FIG. 5 is applied. FIG. 7(*b*) shows a case wherein the cathodes for deposition of a high refractive index film are near to the cathodes (magnetron units) for deposition of a low refractive index film to avoid plasma interference. FIG. 7(*c*) shows a case wherein the monitoring system is provided at a position far from the cathodes in order to prevent plasma from interfering with the monitoring operation for a film thickness. FIG. 7(*d*) shows a case wherein a combination of a transmission monitor and a reflective monitor is used as the film thickness monitoring system.

The transmission monitor is an instrument, which uses a light-emitting head 44 and a light-receiving head 46 to measure the transmittance of substrates 18 as explained with respect to FIG. 1. The reflective monitor an instrument, which emits light from a head 82 toward a substrate 18, receives reflected light by the head 82 and analyzes the received signal to find the transmittance. Although not shown, the reflective monitor uses a halogen lamp 40, a monochromator 41 and an optical fiber 42 to guide measuring light to the head 82 and sends the light (reflected light) received by the head to a PC 50 through a processor for received signals as in the embodiment shown in FIG. 1.

When the transmission monitor and the reflective monitor are both used as shown in FIG. 7(*d*), it is preferable that the film thickness control is performed based on the measurement of reflectance for regions having low transmission values, and that the film thickness control is performed based on the measurement of transmittance for regions having high transmission values. In other words, the transmission value as a reference for determining whether the film thickness control should be changed from the transmission mode to the reflection mode or vice versa (reference value for determination) is previously set. When a transmission value is lower than the reference value for determination, the film thickness control is performed based on the measurement of reflectance. When a transmission value is not lower than the reference value for determination, the film thickness control is performed based on the measurement of transmittance.

FIG. 8 shows typical examples of the target material and the film material, which can be mainly used when the present invention is carried out. With respect to the material for deposition of a low refractive index film, there may be a mode to use a SiC target to deposit a $SiO_2$ film, or a mode to use an alloy made of Si and Al as a target to deposit an oxide film made of $SiO_2$ and $Al_2O_3$, in addition to a mode to use a Si target to deposit a $SiO_2$ film as stated earlier.

With respect to the material for deposition of a high refractive index film, it is possible to deposit different kinds of film materials by selection among the target materials as seen from FIG. 8 in addition to a mode to use a Ti target to deposit a $TiO_2$ film as stated earlier. Other materials, such as oxide, nitride, oxynitride, and carbide, than metal (electrically conductive materials), which can be deposited by DC sputtering, may be used as the target material, though these materials are not listed in FIG. 8.

FIG. 9 shows typical examples of the substrates, which can be used when the present invention is carried out. As shown in this figure, WMS glass manufactured by OHARA Corporation (glass ceramics) is used as the substrates for WDM filters. Various kinds of glass, such as colorless sheet glass, hard glass and artificial crystal, which are listed in FIG. 9, may be used as the substrates for other optical filters according to applications.

Now, other embodiments of the present invention will be described.

Figure 10:
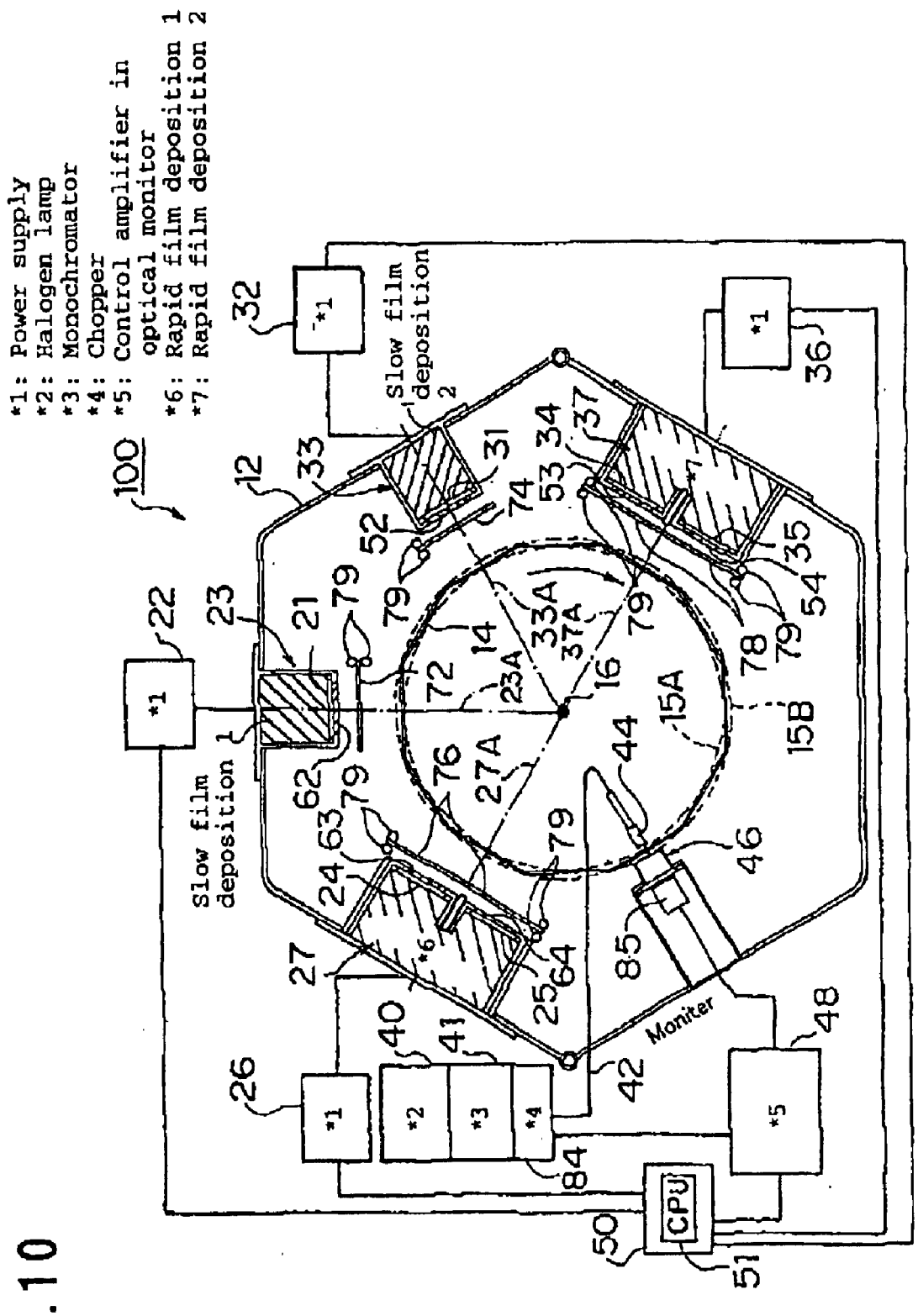
FIG. 10 is a schematic view of the sputtering apparatus for depositing a multilayer optical film according to another embodiment of the present invention.

FIG. 10 is a schematic view of the sputtering apparatus for depositing a multilayer optical film 100 according to another embodiment. In this figure, members identical or similar to those in the embodiments shown in FIGS. 1 and 5 are indicated by the same reference numerals as the embodiments shown in FIGS. 1 and 5, and explanation of the members will be omitted. In FIG. 10, a conventional magnetron 23 indicated as "slow film deposition 1" and an AC magnetron 27 indicated as "rapid film deposition 1" are sputtering sources for deposition of a low refractive index film. A conventional magnetron 33 indicated as "slow film deposition 2" and an AC magnetron 37 indicated as "rapid film deposition 2" are sputtering sources for deposition of a high refractive index film.

The respective magnetrons 23, 27, 33, 37 are provided so as to be faced to the center of rotation of the substrate holders 14 (central shaft 16), such that the respective magnetrons have respective centerlines 23A, 27A, 33A, 37A (lines passing through the centers of the respective magnetrons and extending perpendicular to target supporting surfaces) intersecting with the center of rotation. Provided that the regular dodecagonal shape defined by the substrate holders 14 has the inscribed circle and the circumscribed circle, respectively, indicated by references 15A and 15B, the distance between a substrate holder 14 and the magnetron 23, 27, 33 or 37 facing the substrate holder is variable in the range from the inscribed circle 15A and the circumscribed circle 153 as the substrate holders rotate. In this figure, there is shown a state wherein the distance between the central point on the magnetron 23 and the central point on the substrate supporting surface of the substrate holder confronting thereto, the distance between the central point on the magnetron 27 and the central point on the substrate supporting surface of the substrate holder confronting thereto, the distance between the central point on the magnetron 33 and the central point on the substrate supporting surface of the substrate holder confronting thereto, and the distance between the central point on the magnetron 37 and the central point on the substrate supporting surface of the substrate holder confronting thereto are all made to the minimum (a state wherein the targets are positioned so as to confront the relevant substrates).

Shutters 72, 72, 76, 78 are configured so as to be opened and closed by rotary forces given from respective rollers 79, and the opening and closing operation of the respective shutters 72, 72, 76, 78 is controlled in cooperation with the control operation of corresponding sputtering sources 22, 26, 32, 36.

When a halogen lamp 40 is used as the light source for the film thickness monitoring system, a chopper 84 is provided at the output of a monochromator 41 as shown in FIG. 10. A noise component, which is contained in the light source, is eliminated by the comparator in a processor for received light 48 while output light (monochromatic light) from the monochromator 41 is periodically blocked off by the chopper 84. The processor for received light 48 includes control amplifiers (indicated by reference numeral 49 in FIG. 11), which output a modulated signal to activate the chopper 84 and convert the voltage value of a received signal into a digital signal to provide a CPU 51 with the digital signal.

Figure 11:
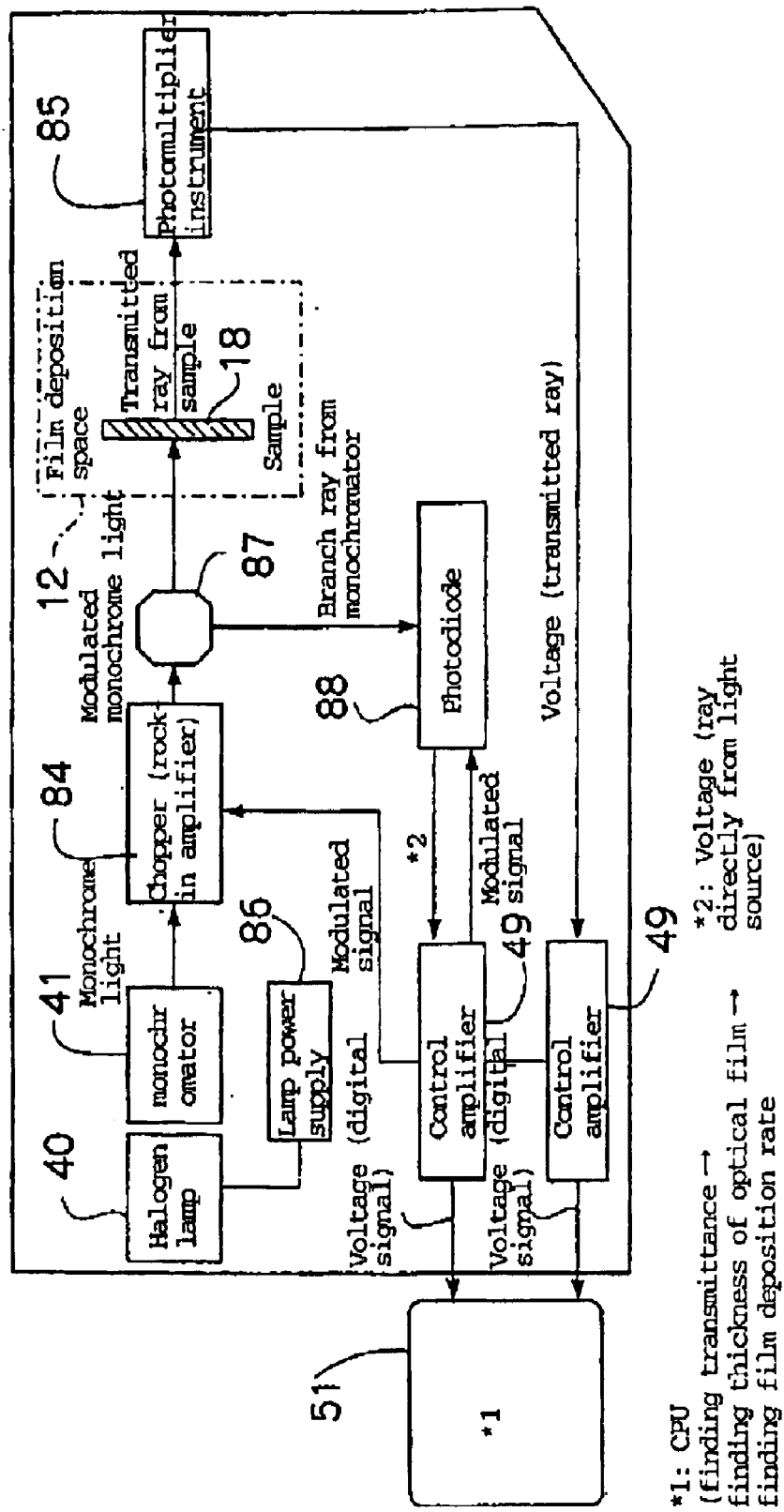
FIG. 11 is a block diagram showing the detailed structure of a film thickness monitoring system using a halogen lamp.

FIG. 11 is a block diagram showing the detailed structure of the film thickness monitoring system using the halogen lamp. The halogen lamp 40 emits light, being provided with power by a lamp power supply 86. The light (white light) emitted from the halogen lamp 40 is converted into monochromatic light by the monochromator 41, and the monochromatic light enters the chopper 84. The chopper 84 is activated in accordance with the modulated signal given by a control amplifier 49 and outputs monochromatic light, which has been modified through the chopper 84. The modulated monochromatic light is divided into two rays by a light divider (such as a half mirror) 87, and one of the rays is introduced into a chamber 12 as a film deposition space to irradiate a substrate 18 to be measured (corresponding to a sample to be measured). The ray that has passed through the substrate 18 enters a photomultiplier instrument 85 to be converted into a voltage signal in response to the light amount of the transmitted ray. The voltage signal output from the photomultiplier instrument 85 is converted into a digital signal by the other control amplifier 49 and is sent to the CPU 51.

The other ray, which has been divided by the light divider, enters a photodiode 88 to obtain information on the light source. The control amplifier 49 provides the photodiode 88 with a modulated signal for synchronization with the chopper 84. The photodiode 88 outputs a voltage signal in response to the light amount of direct light, which is emitted from the monochromator 41. The voltage signal output from the photodiode 88 is converted into a digital signal by the control amplifier 49 and is sent to the CPU 51.

The CPU 51 carries out operations, such as, finding a transmission value, finding the thickness of an optical film and finding a film deposition rate, based on the data for the transmitted ray received from the other control amplifier 49 and the data for the direct light.

The present invention is not limited to the mode wherein the white light from the halogen lamp 40 is irradiated onto the substrate 18 after being changed into monochromatic light by the monochromator 41. The white measuring light is irradiated onto the substrate 18, and the light is changed into monochromatic light on a light receiving side. In the latter case, the monochromator is provided, preceding the light-receiving head 46. The mode wherein the light is changed into monochromatic light on the light receiving side can reduce noise more greatly than the mode wherein the white measuring light is used.

The present invention may adopt a system structure shown in FIG. 12, instead of the system structure shown in FIG. 11. In FIG. 12, members identical or similar to those in the embodiment shown in FIG. 11 are indicated by the same reference numerals as the embodiment shown in FIG. 11, and explanation of the members will be omitted. In the embodiment shown in FIG. 12, a variable wavelength laser 90 is used as the light source, and a desired output wavelength is selected by the grating in the variable wavelength laser unit. The provision of the variable wavelength laser 90 can eliminate the monitoring of the direct light stated in reference to FIG. 11 since the output from the variable wavelength laser is stable. Although modulated monochromatic light is used in the embodiment shown in FIG. 12, the monochromatic light may be used without being modulated. A light divider 87 shown in FIG. 12 may be eliminated.

In the case of the carousel-type sputtering apparatus, since film deposition is performed with the respective substrate holders combined in a regular polygonal shape being rotated, sides of a regular polygon are different from corners of the regular polygon in terms of the shortest approaching distance to the relevant target and the angle of the substrate surface to the target as pointed out in JP-A-3-253568. Since the deposition probability of sputtered atoms varies from position to position on a substrate, there is a tendency that the film thickness distribution becomes uneven with respect to the rotational direction of the substrates (referred as to the advancing direction in the sense that the substrates advance in the transverse direction, rotating).

Figure 13A:
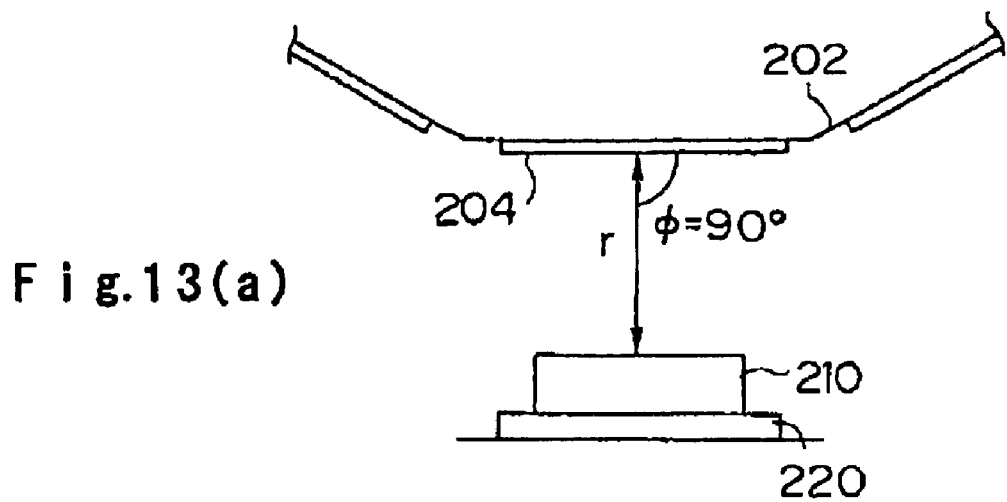
FIGS. 13(a) to (c) are schematic views explaining the nonuniformity in the film thickness distribution in a conventional carousel-type sputtering apparatus.
Figure 13B:
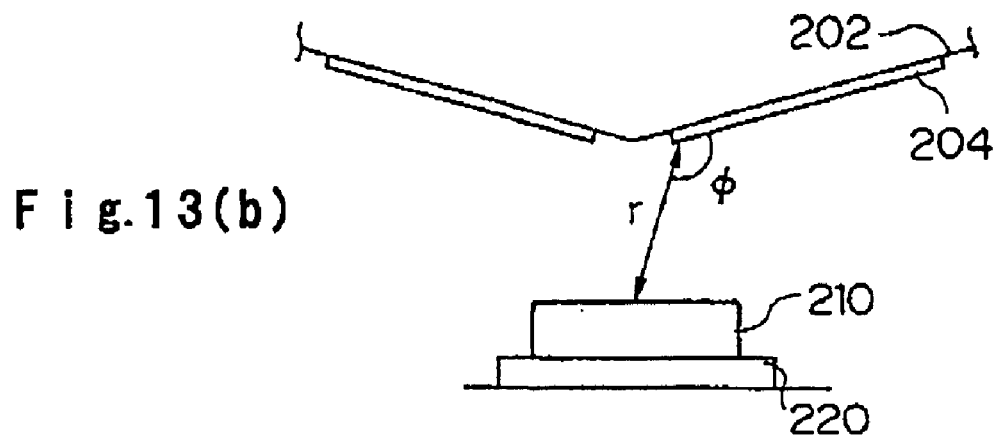
Figure 13C:
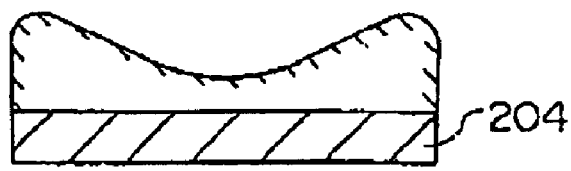

FIGS. 13(a) to (c) are schematic views with respect to the uneven film thickness distribution. FIG. 13(a) shows a state wherein a portion occupying a side of the regular polygonal formed by the substrate holders 202 is located at a position nearest to a target 210. FIG. 13(b) shows a state wherein a portion occupying a corner of the regular polygonal is located at a position nearest to a target 210. Reference numeral 220 designates a backing plate of the magnetron unit with the target 210 mounted thereon. The deposition probability of sputtered atoms depends on the distance r from the target 210 to each of positions on the surface of a substrate 204, the direction thereof (referred to as the vector <r>) and the angle φ included between the vector <r> and the substrate surface.

As shown in FIGS. 13(a) and 13(b), the portion occupying a side of the regular polygon is different from the portion occupying a corner of the regular polygon in terms of the vector <r> and the angle φ as the substrate holders 202 rotate. As a result, the conventional deposition methods have had a tendency that the substrate 204 has more atoms deposited on a peripheral position to make the film thickness on the peripheral position greater than the film thickness on a central position as shown in FIG. 13(c).

In order to make the film thickness uniform according to the present invention, the sputtering apparatus 100 according to this embodiment uses a target as shown in FIGS. 14(a) and (b). FIG. 14(a) is a cross-sectional view, and FIG. 14(b) is a plan view. The target 92 is applied to each of the sputtering sources for slow film deposition indicated by reference numerals 23 and 33 in FIG. 10. The target has an upper surface formed in a roof shape (an inverted V-character shape) so that the upper surface has the peak at a central portion (a ridge 92C extending along the rotational shaft of the drum 17) and portions on both sides of the central portion inclined toward right and left directions as shown in FIGS. 14(a) and (b). The inclination angle θ to an imaginary horizontal surface may be set to the optimum angle required to establish the uniformess in the film thickness distribution in consideration of the number of the corners of the regular polygon formed by the substrate holders 14, the diameter of the regular polygon, the dimensions of the substrates, the substrate-target distance (the average distance in design) and other factors.

The conventional targets have been formed as a flat-shaped plate having a constant thickness. When the conventional targets take a position to confront a substrate, the confronting surface of the targets has been in a state parallel with the confronting substrate (see FIG. 13(a)). On the other hand, the target 92 shown in FIGS. 14(a) and (b) has confronting surfaces slightly inclined at an angle (inclination angle θ) with respect to the confronting surface of a relevant substrate when the target confronts the substrate.

Figure 15A:
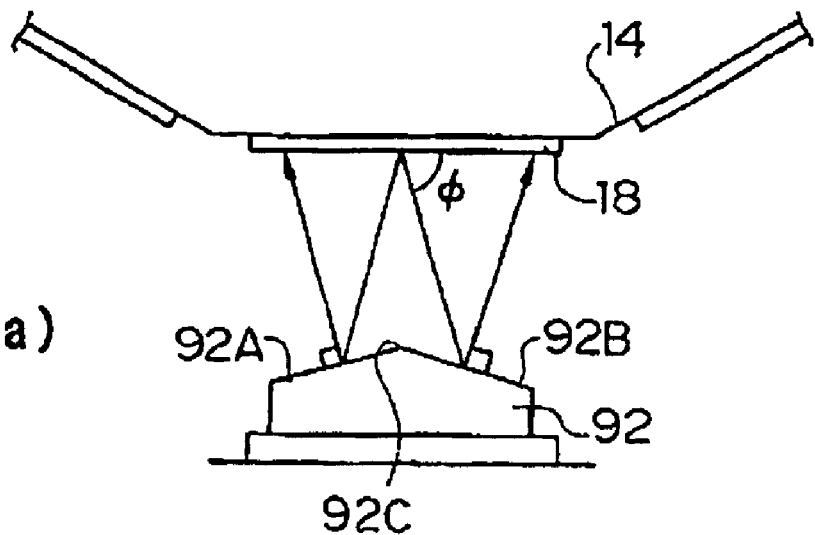
FIGS. 15(a) to (c) are schematic views explaining an inclination-type target function.
Figure 15B:
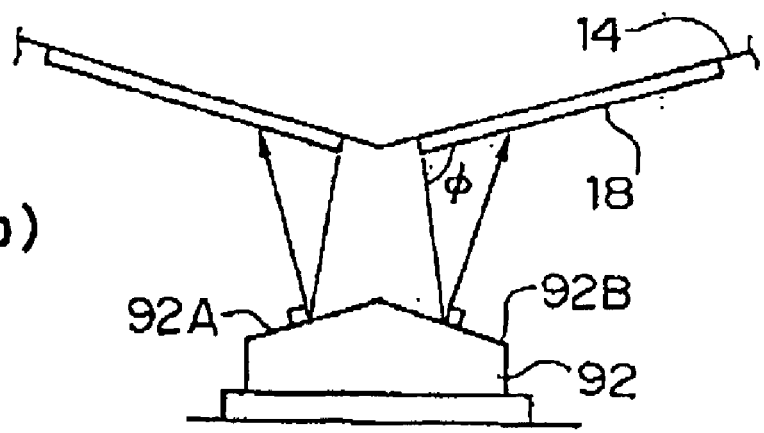
Figure 15C:
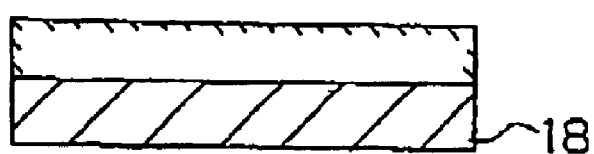

By using the target 92 thus constructed, the scattering distribution of sputtered atoms (the density of sputtered atoms) is widened in directions normal to the target inclined surfaces 92A, 92B (in other words, emission is made in a V-character shape) since the sputtered atoms are emitted from the target inclined surfaces 92A, 92B. Additionally, required conditions, such as the distance from the target inclined surfaces 92A, 92B to each of positions on the surface of a substrate 18, the direction thereof (the vectors <r>), and the angle φ included between the vector <r> and the substrate surface, can be well-balanced to make the film thickness uniform in the advancing direction of the substrate 18 (in a lateral direction) as shown in FIG. 15(c).

Figure 16:
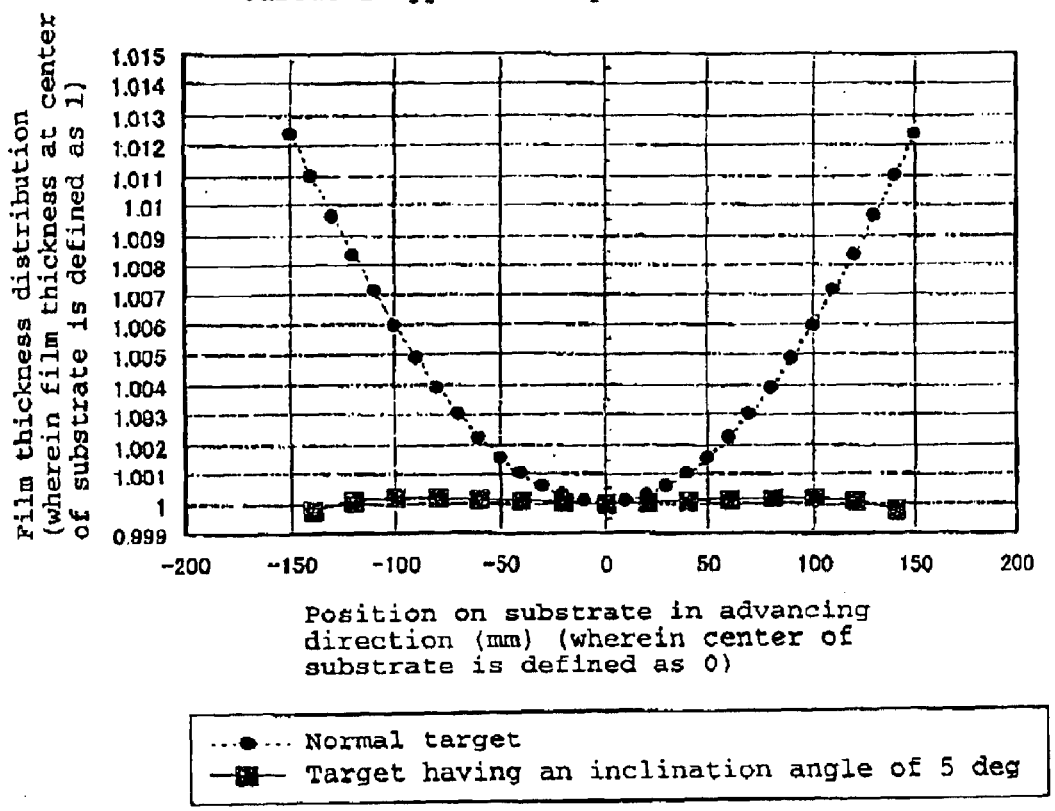
FIG. 16 is a graphical representation showing a comparison between the film thickness distribution made by film deposition using the inclination-type target shown in FIG. 14 and the film thickness distribution made by film deposition using a conventional flat target (normal target)

FIG. 16 is a graphical representation showing a comparison between the film thickness distribution made by film deposition using the inclination type target 92 according to the present invention and the film thickness distribution made by film deposition using a conventional flat type target (normal target). The graphical representation shown in this figure shows the experimental results that were obtained under the following experimental conditions. Specifically, the experiment was conducted in the sputtering apparatus 100 shown in FIG. 10, which included respective substrate holders combined in a regular dodecagonal shape having a diameter of 1 m, the substrate-target distance being 60 mm and the respective substrates having an area of 35 cm square. The experimental results were obtained by conducting the film deposition with a normal target mounted on the sputtering source for slow film deposition indicated by reference numeral 23 (or 33) in the sputtering apparatus and by conducting the film deposition with an inclination type target 92 (having an inclination angle θ=5 dig) mounted on this sputtering source for slow film deposition in the same sputtering apparatus. The sputtering apparatus had expansion jigs for a substrate holder mounted on every other substrate holder surface for mounting a substrate having an area of 35 cm square.

As clearly seen from FIG. 16, the substrate dealt with by the normal target had a greater film thickness on a peripheral portion than a central portion, while the substrate dealt with by the inclination type target 92 according to the present invention had a uniform film thickness distribution in the advancing direction.

As in the sputtering sources for slow film deposition, each of the sputtering sources for rapid film deposition indicated by reference numerals 27, 37 in FIG. 10 has inclination type targets 94, 95 shown in FIGS. 17(a) and (b) applied thereto. The target 94 shown as a cross-sectional view in FIG. 17(a) and as a plan view in FIG. 17(b) is used as each of targets indicated by reference numerals 63, 54 in FIG. 10. The target 95 shown as a cross-sectional view in FIG. 17(c) and as a plan view in FIG. 17(d) is used as each of targets indicated by reference numerals 64, 53 in FIG. 10. Each of the sputtering sources for rapid film deposition (AC magnetrons) has the two adjacent targets provided therein so as to be axially symmetrical (or substantially axially symmetrical) each other since it is impossible to make the film thickness uniform when the target surfaces of both targets are inclined in a single direction.

The respective targets 94, 95 shown in FIGS. 17(a) to (d) are designed so as to have an inclination angle set as an optimum angle, depending on specific conditions of the sputtering apparatus. As stated with respect to FIG. 1, each of the AC magnetrons for rapid film deposition has the anode/cathode relationship alternately changed between the targets mounted on the two adjacent magnetron units so as to serve as one sputtering source as a whole. Since each of the right and left targets 94, 95 has a single inclined surface (has a surface inclined in a single direction to form a wedge shape), the two targets 94, 95 can be combined to provide a roof-shaped target surface as in the target 92 stated with respect to FIGS. 14(a) and (b). The statement with respect to FIGS. 15(a) to (c) is applicable to the function of the targets 94, 95 shown in FIGS. 17(a) to (d).

Figure 18:
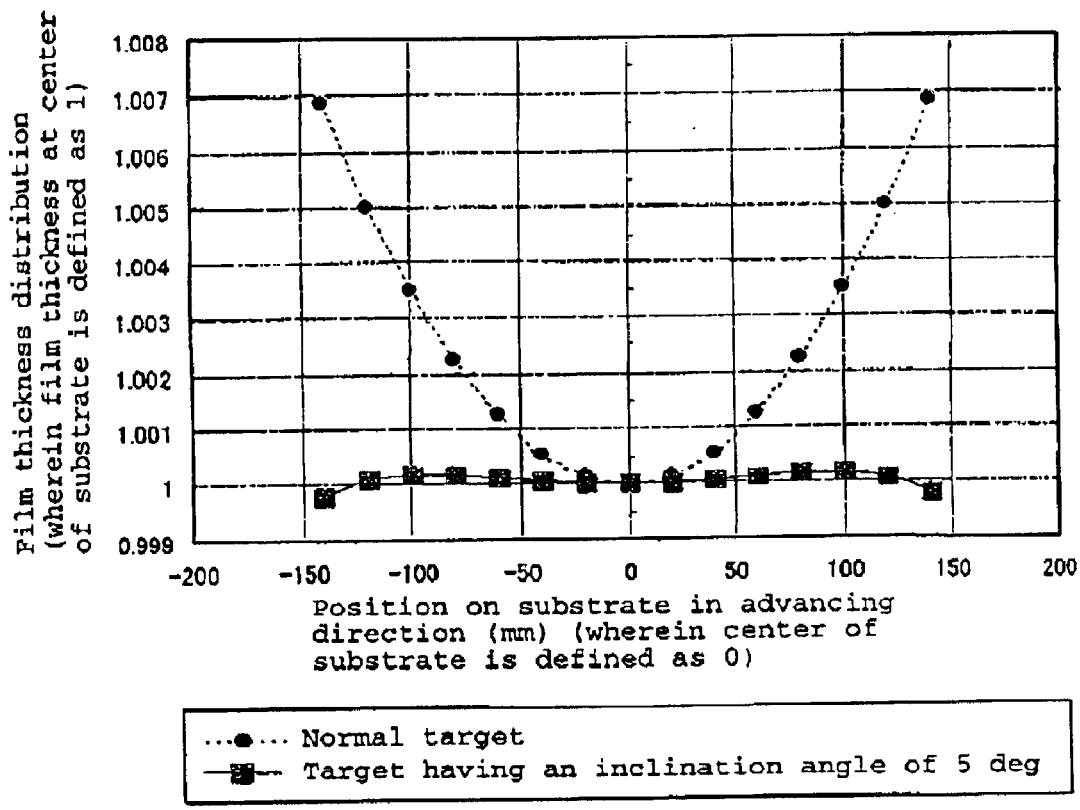
FIG. 18 is a graphical representation showing comparison between the film thickness distribution by film deposition using the inclination-type targets shown in FIG. 17 and the film thickness distribution by film deposition using a conventional flat target (normal target)

FIG. 18 is a graphical representation showing a comparison between the film thickness distribution made by an AC magnetron with the inclination type targets 94, 95 shown in FIGS. 17(a) to (d) used therein and the film thickness distribution made by an AC magnetron with a conventional flat type target (usual target) used therein. The graphical representation shown in FIG. 18 shows the experimental results that were obtained under the following experimental conditions. Specifically, the experiment was conducted in the sputtering apparatus 100 shown in FIG. 10, which included respective substrate holders combined in a regular dodecagonal shape having a diameter of 1 m, the substrate-target distance being 60 mm and the respective substrates having an area of 35 cm square. The experimental results were obtained by conducting the film deposition with the normal target mounted on the sputtering source for rapid film deposition indicated by reference numeral 27 (or 37) in the sputtering apparatus and by conducting the film deposition with the inclination type targets 94, 95 (having an inclination angle θ=5 dig) mounted on this sputtering source for rapid film deposition in the same sputtering apparatus. The sputtering apparatus had expansion jigs for a substrate holder mounted on every other substrate holder surface for mounting a substrate having an area of 35 cm square.

As clearly seen from FIG. 18, the substrate dealt with by the normal target had a greater film thickness on a peripheral portion than a central portion, while the substrate dealt with by the inclination type targets according to the present invention had a uniform film thickness distribution in the advancing direction.

The present invention is also operable in a mode wherein targets 96, 97 shown in FIGS. 19(a) to (d), instead of the targets shown in FIGS. 17(a) to (d), are used. In other words, the targets 96 shown in FIGS. 19(a) and (b) may be replaced by the target 94 shown in FIGS. 17(a) and (b), and the target 97 shown in FIGS. 19(c) and (d) may be replaced by the target 95 shown in FIGS. 17(c) and (d). FIGS. 19(a) to (d) show a mode wherein the right and left targets 96, 97 to be applied to each of the AC magnetrons have an upper surface formed in a roof-shape (a reversed V-character shape). The inclination angle (θ1) of inner inclined surfaces 96A, 97A, and the inclination angle (θ2) of outer inclined surfaces 96B, 97B are designed to be set at proper values, depending on the structural conditions of the sputtering apparatus 100 and another factor. By this arrangement, the film thickness is made uniform in the advancing direction.

Now, another embodiment of the method for monitoring the film thickness will be described.

Light that satisfies the following formula (1) with respect to a targeted optical film thickness nd (wherein n is the refractive index of a film, and d is the physical film thickness of the film) is used as measuring light, and the measuring light is vertically directed into a substrate during film deposition (at an incident angle=0° to measure the transmittance (or the reflectance).

(Formula 1) $nd=m\lambda/4$ (wherein $m$ is a positive integer, and $\lambda$ is the wavelength of the light) (1)

When the optical film thickness of a deposited film becomes an integral multiple of ¼ of the measured wavelength λ (i.e., when the formula (1) is satisfied), the transmittance (reflectance) has peak values.

Figure 20:
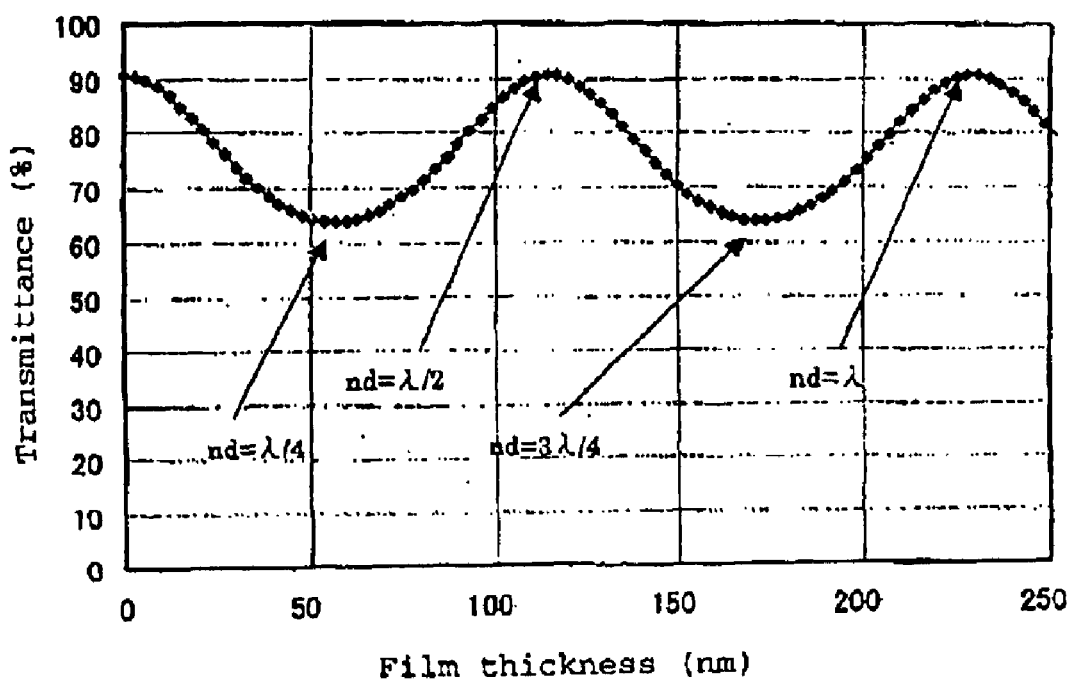
FIG. 20 is a graphical representation showing changes in the transmittance of light having a wavelength of 550 nm when a film of $TiO_2$ is deposited on a glass substrate.

FIG. 20 is a graphical representation showing changes in the transmittance with respect to measuring light having a wavelength of 550 nm when a film of $TiO_2$ (n=2.4) is deposited on a glass substrate. In this figure, the horizontal axis indicates film thicknesses (geometrical film thicknesses d) of the deposited film, and the vertical axis indicates transmittance. As shown in this figure, the transmittance has peak values when the optical film thickness is an integral multiple of λ/4.

Making use of the phenomenon stated earlier, light having a wavelength λ satisfying the formula (1) to a targeted film thickness may be used to perform the monitoring of the film thickness and the film deposition control.

However, the incident angle and the measuring position (monitoring position) of measuring light constantly change in the case of the carousel-type sputtering apparatus shown in FIG. 1 or FIG. 10 since the substrate holders 14 are rotating. When the transmission values of measuring light greatly change in a case wherein the incident angle of the measuring light changes, it becomes difficult to perform the measurement and the film deposition control with good precision. In the case of a film structure having 10 layers or more, it is actually difficult to the film thickness measurement and the film deposition control by conventional methods since the positions of peak transmission values of measuring light or the transmission values of measuring light change as the incident angle of the measuring light changes.

The solution for solving the problem stated above will be explained, referring to specific examples.

Figure 21:
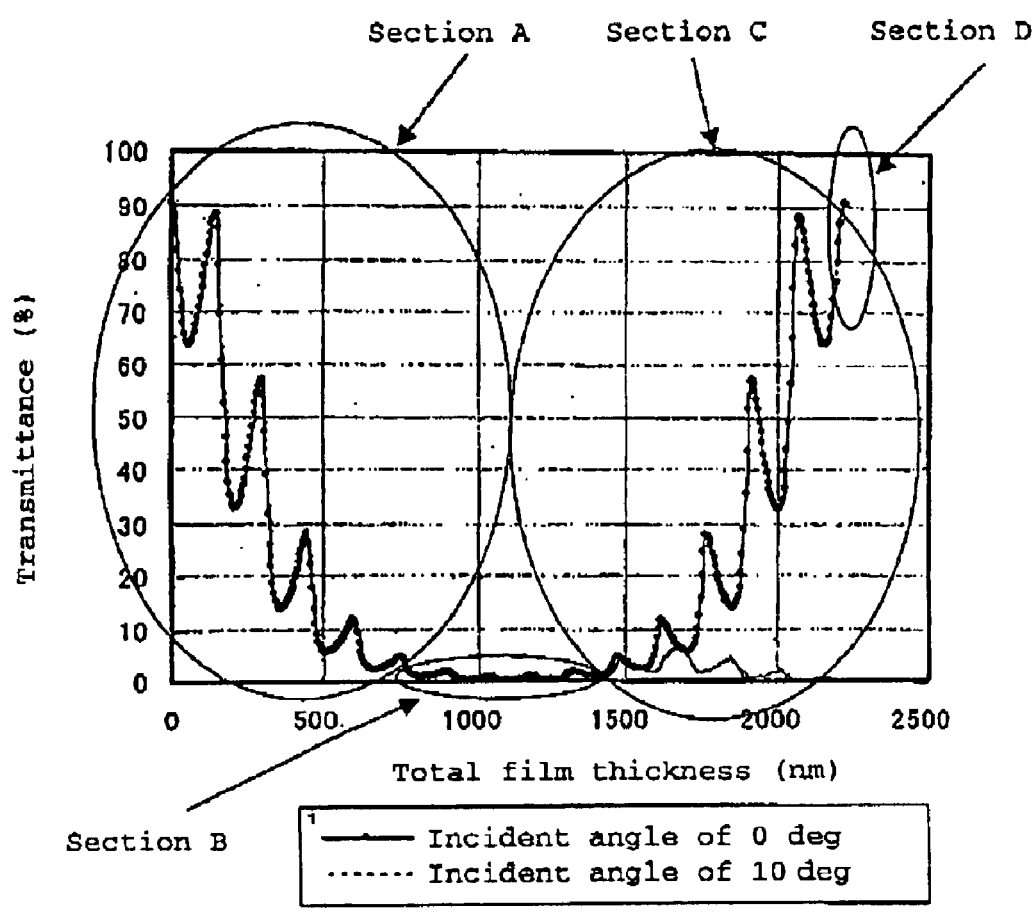
FIG. 21 is a graphical representation showing changes in the transmittance of measuring light having a wavelength of 550 nm, which was obtained when a bandpass filter (having a central wavelength of 550 nm) was formed so as to include 29 layers having a film structure of glass/($TiO_2$ 92.9 nm/$SiO_2$ 57.3 nm)$^7$/$TiO_2$ 185.8 nm/($SiO_2$ 57.3 nm/$TiO_2$ 92.9 nm)$^7$, and one cavity.

FIG. 21 is a graphical representation showing changes in the transmittance of measuring light having a wavelength of 550 nm, which was obtained when a bandpass filter (having a central wavelength of 550 nm) was formed so as to include 29 layers having a film structure of glass/($TiO_2$ 92.9 nm/$SiO_2$ 57.3 nm)$^7$/$TiO_2$ 185.8 nm/($SiO_2$ 57.3 nm/$TiO_2$ 92.9 nm)$^7$, and one cavity.

Focusing on the optical properties of the films in respective stages in the film deposition process, the film deposition process can be considered, being divided into 4 sections of sections A to D as shown in FIG. 21.

The section A (the first layer to the twelfth layer) is a section, wherein the transmission value greatly depends on the film thickness but does not almost depend on the incident angle of measuring light. Actually, the transmission value for an incident angle of 0 dig is almost the same as the transmission value for an incident angle of 10 dig. The section B (the thirteenth layer to the eighteenth layer) is a section, wherein the transmission value does not almost depends on the film thickness or the incident angle of measuring light, and wherein the changes in the transmittance are small. The section C (the nineteenth layer to the twenty-ninth layer) is a section, wherein the transmission value depends on both of the film thickness and the incident angle of measuring light. The transmission value for an incident angle of 0 dig and the transmission value for an incident angle of 10 dig are quite different from each other, and the transmission values for an incident angle of 10 dig are small values (less than 10%). The section D (the 29th layer) is a section for adjusting the optical property.

Each of the respective sections may be subjected to the monitoring operation and the film deposition control suited thereto to improve the precision of the monitoring operation and the controllability of the optical properties of the films. The control methods for the respective sections will be described.

<Film Thickness Control in the Section A>

Figure 22:
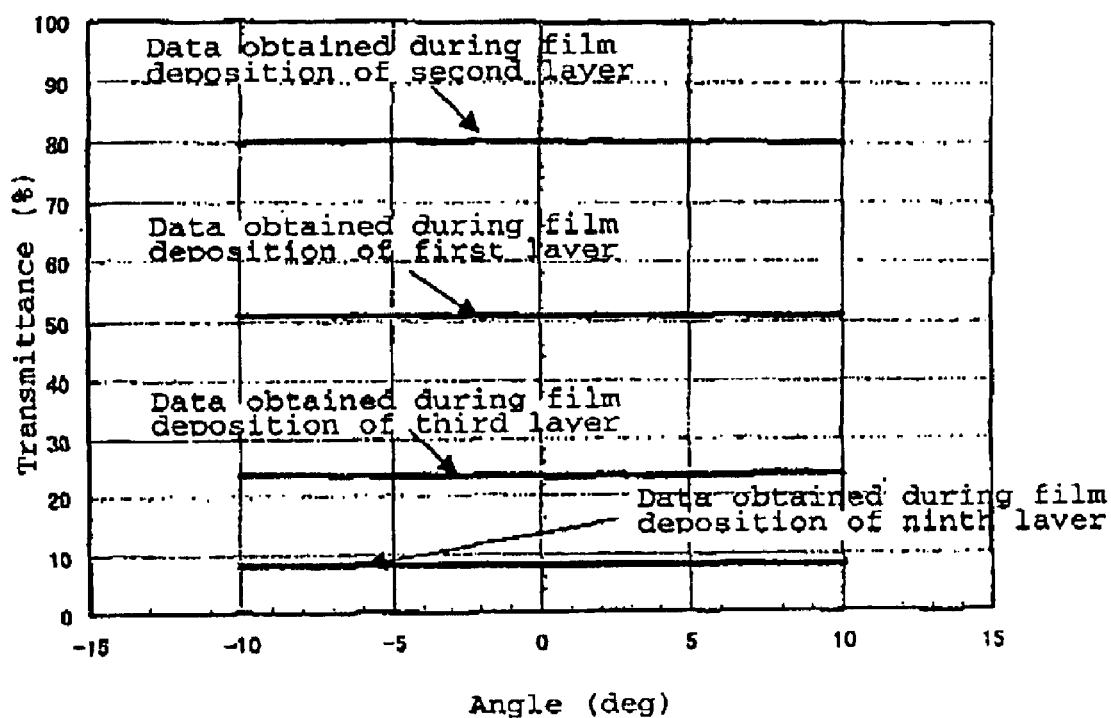
FIG. 22 is graphical representations showing the angular dependency of the data on the transmittance, which are obtained during film deposition in the section A shown in FIG. 21.

FIG. 22 is graphical representations showing the angular dependency of the data on the transmittance, which were obtained during the film deposition of each of the first layer, the second layer, the third layer and the ninth layer. In the section from the first layer to the twelfth layer (the section A), changes in the incident angle have almost no effect on the transmittance as shown in FIG. 22. This means that it is possible to obtain a value substantially equal to the transmission value for vertical incidence by finding the average value of the data on the transmittance in a range from about ±5 dig to about ±15 dig, which are successively acquired while a substrate is rotated. It is possible to control the film thickness by a method wherein the time when the transmittance has a peak is found based on the transmission value for vertical incidence thus obtained, and the film deposition is stopped at the time when the transmission value actually becomes the peak value. Although the center of a substrate 18 to be measured is measured when the incident angle is 0 dig, positions farther from the center of the substrate are monitored as the incident angle becomes greater. This is because the substrate is rotated. However, in despite of that the monitored position changes, the control method according to the present invention allows the film thickness to be correctly measured, coupled with provision of a uniformed film thickness distribution in the advancing direction of the substrate by use of the inclination-type targets stated with respect to FIGS. 14(a) to 19(d).

<Film Deposition Method in the Section B>

In the section from the thirteenth layer to the eighteenth layer, it is difficult to perform the film thickness with good precision since the transmission values are small and since a change in the transmittance to an increase in the film thickness is small. For this reason, the film thickness in the section B is controlled, in terms of the time period for deposition for each of the layers, by a method wherein the data on the transmittance are collected only as reference data, the film deposition rate at a current stage is mainly found by the relationship between a variation in the transmittance and the time period for deposition in the film deposition process for the first layer to the twelfth layer, and the film deposition for each of the layers is stopped when the time period, which is supposed to be required for obtaining a desired film thickness, has passed.

<Film Deposition Method in the Section C>

Figure 23:
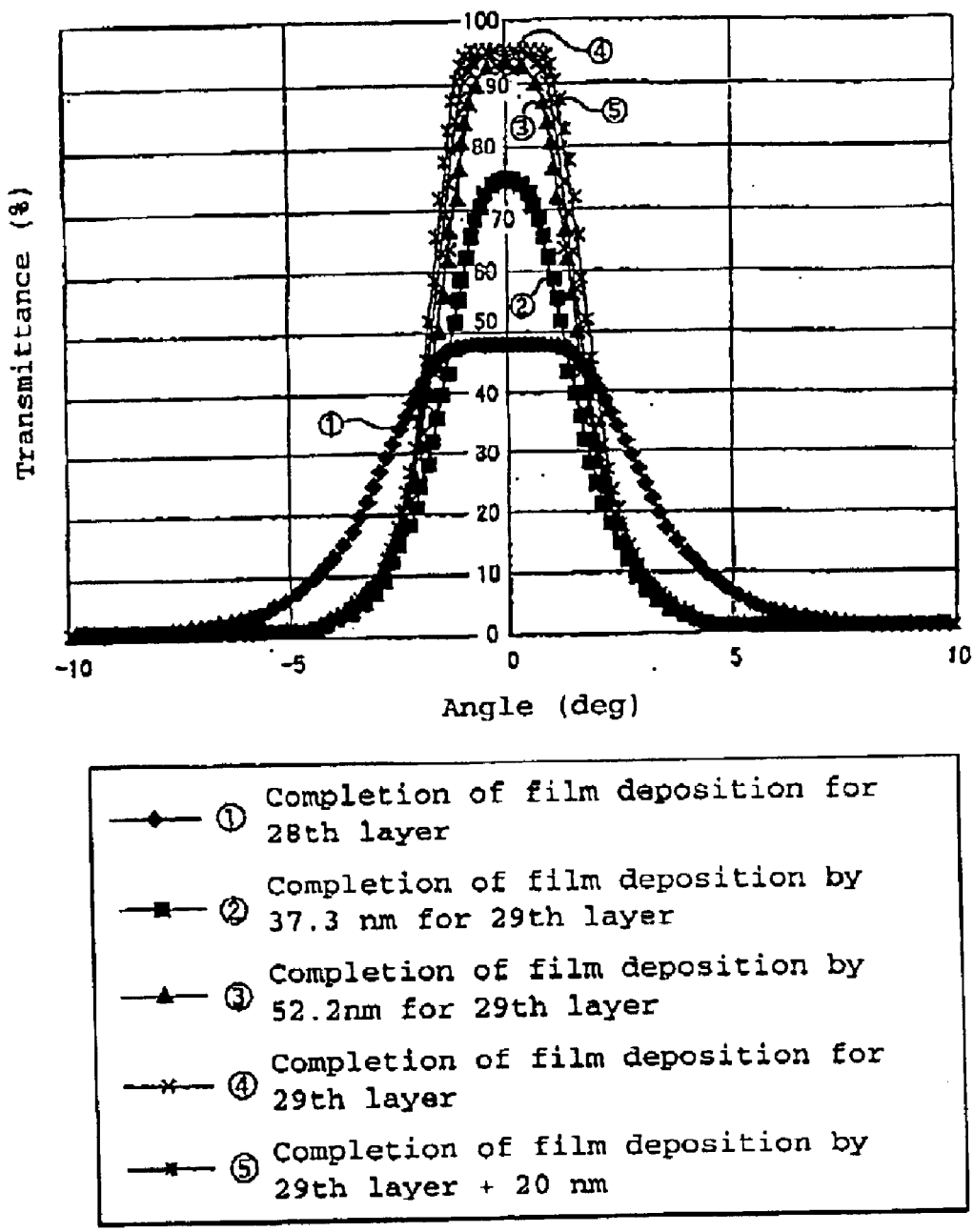
FIG. 23 is graphical representation showing the angular dependency of the transmittance on the twenty-eighth layer and the subsequent layer in FIG. 21.

FIG. 23 is graphical representations showing the angular dependency of the transmittance for the twenty-eighth layer and the subsequent layer. In the section from the nineteenth layer to the twenty-ninth layer (the section C), it is difficult to adopt the same control method as the one for the section A since the transmission values change, depending on angles, as shown in FIG. 23. However, it is possible to find the transmittance for vertical incidence (an incidence angle of 0 dig), even without an accurate trigger signal indicating the timing when the incident angle is 0 dig, by computing the data on the transmittance obtained by measurement. This is because the points indicating the transmittance for an incident angle of 0 dig intersect with the axis of symmetry, with respect to which the transmittance curves acquired by measurement are axially symmetrical as shown in FIG. 23. Additionally, it is possible to determine the film thickness that has a peak value, based on the peak position of the relevant transmittance curve acquired by measurement, or the change rate to the relevant angle or the relevant area (the shape of the relevant curve). It is also possible to find the spectral transmittance on a longer wavelength side for a measured wavelength λ by approximately converting the transmittance curve, which has been obtained by changing angles, as shown in FIG. 24.

Figure 24:
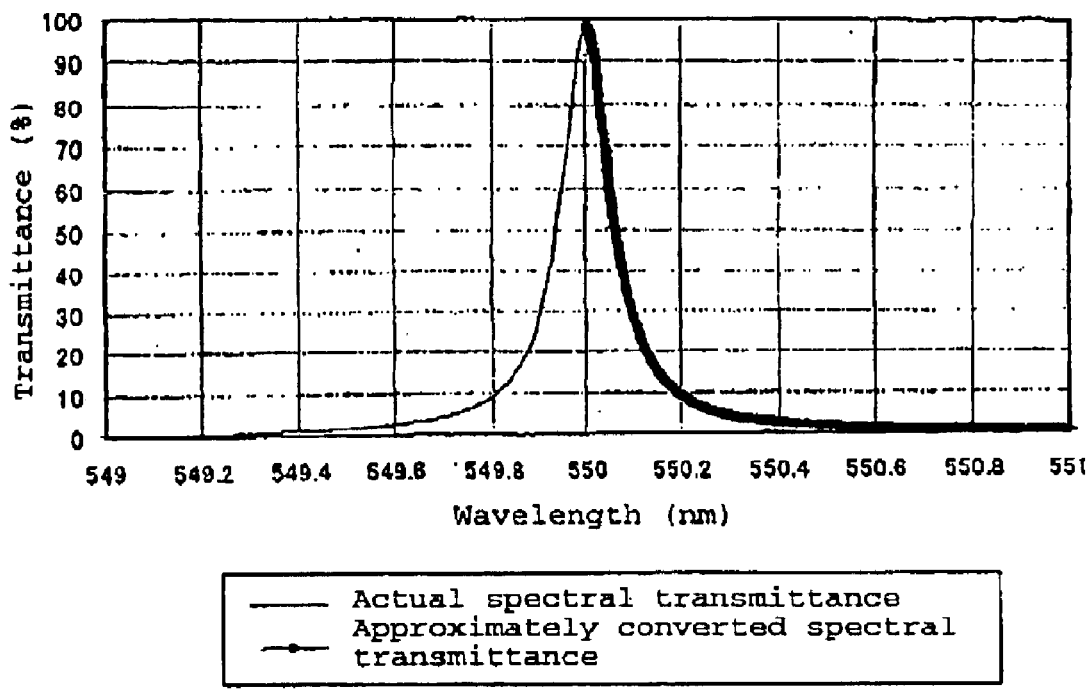
FIG. 24 is a graphical representation showing the spectral transmittance, which is obtained by approximately converting the data on the transmittance curve acquired in a range of ±10° with respect to an incident angle of 0°, wherein measuring light having a wavelength of 550 nm is used.

FIG. 24 is a graphical representation showing the spectral transmittance, which is obtained by approximately converting the data on the transmittance curve acquired in a range of ±10 dig with respect to an incident angle of 0 dig. It is possible to predict the spectral transmittance for the long wavelength side of the measured wavelength λ (=550 nm), i.e., for 550 nm≦λ≦552.35 nm based on the data in the range of ±10°. The values thus predicted correspond with the actual spectral transmittance (the spectral transmittance experimentally detected) with extremely high precision as shown in FIG. 24.

<Film Deposition Method in the Section D>

In some cases, a desired optical property can not be obtained since the actual film thickness has had an error with respect to the targeted film thickness in the deposition process on any of the layers, which have been deposited one after another. In order to cope with this problem, a layer for correcting the optical property is provided in the deposition process. In this example, the twenty-ninth layer (last layer) serves as the correcting layer, and the section for depositing this layer is called the section D.

Figure 25:
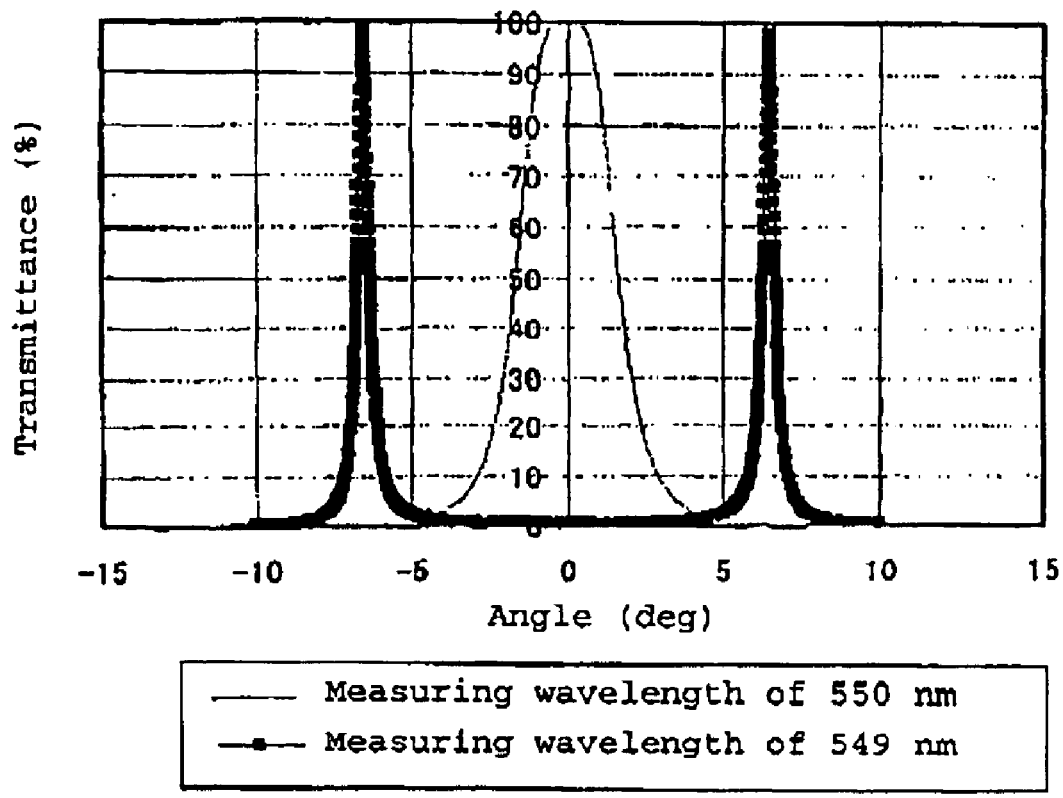
FIG. 25 is graphical representations showing the data on the transmittance curve acquired in a range of ±10° with respect to an incident angle of 0°, wherein measuring light having a wavelength of 549 nm is used.
Figure 26:
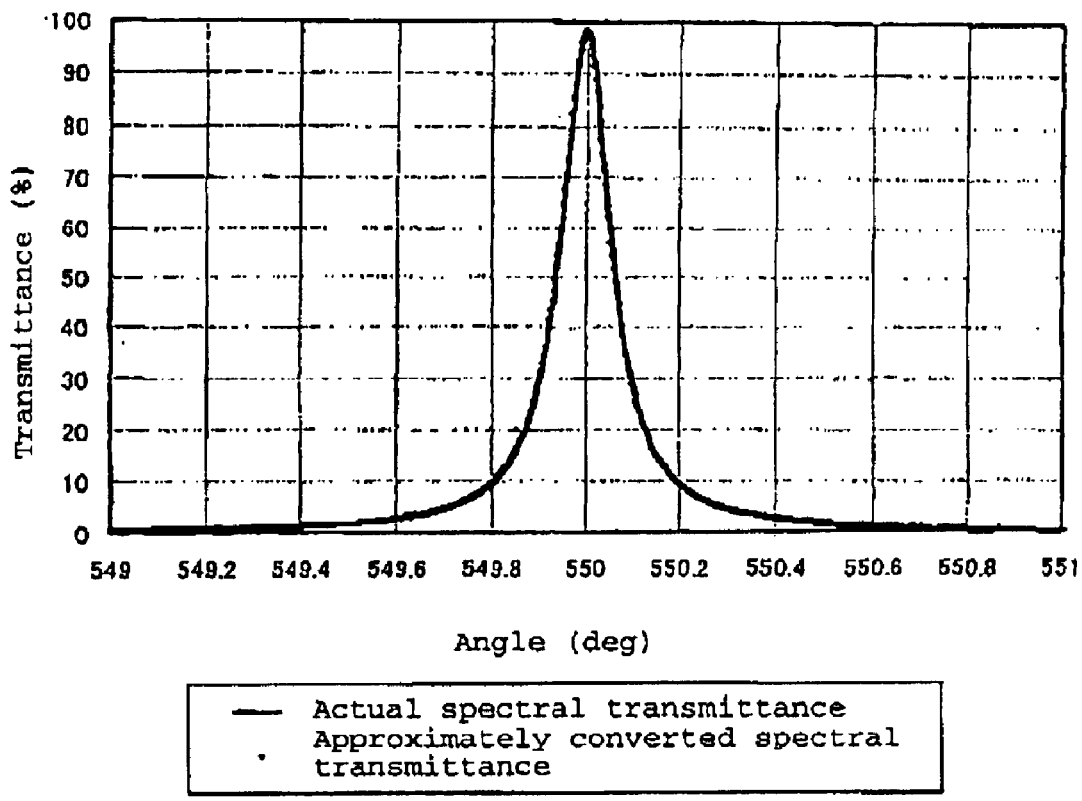
FIG. 26 is graphical representations showing the spectral transmittance, which is obtained by subjecting the data shown in FIG. 25 to approximate conversion.

In this section D, the transmittance is measured by using measuring light having a wavelength, which is slightly deviated toward a longer wavelength side from the measuring wavelength (λ=550 nm) satisfying the formula (1). In this example, the signals shown in FIG. 25 are obtained by performing the measurement with measuring light having a wavelength of λ=549 nm. Based on the data thus obtained, it is possible to find the spectral transmittance for a wavelength on the longer wavelength side of the measured wavelength of λ=549 nm, i.e., for 549 nm≦λ≦551.35 nm as shown in FIG. 26 by making approximate conversion as in the section C stated earlier.

The spectral transmittance thus found corresponds with the actual spectral transmittance with extremely high precision. It is possible to observe all of "the central wavelength", "the transmittance at a specific wavelength" and "the bandwidth" as the optical specifications for a bandpass filter by obtaining the profile of a spectral transmittance as shown in FIG. 26 during the film deposition process. By this method, it is possible to improve product yield (the rate of nondefective products) since the film thickness (i.e., the optical property) can be corrected, while making sure whether the targeted specifications are met. Although light having a wavelength of λ=549 nm was used as the measuring light having a wavelength slightly deviated toward the shorter wavelength side from the measuring wavelength of λ=550 nm in this example, the wavelength of light used for measurement may be changed according to the kind and the number of the stages (the number of the layers) to be measured.

Although explanation of the embodiment is made for the case wherein the transmittance is found, the reflectance instead of the transmittance, or the reflectance as well as the transmittance may be found.

Although the sputtering apparatus shown in FIG. 10 has all magnetron units provided with the inclination-type targets therein, the present invention is operable even in a mode wherein a normal target and the inclination-type targets coexist in the single sputtering apparatus.

<Technique for Improving the Monitoring Precision for the Film Thickness>

Now, the method for increasing the measuring precision for the film thickness will be described.

When the transmittance or the reflectance is measured as an optical property during film deposition, there is caused a problem that it is difficult to conduct spectral measurement with high precision since the light-receiving unit could detect light that is not emitted from the light-emitting unit (mainly plasma light generated in the film deposition space surrounding each of the magnetrons). With respect to this problem, a lock-in amplifier, which is synchronized with the chopping frequency, can be used to minimize noise.

However, it is difficult to completely eliminate the noise since the emission intensity of plasma in the film deposition by sputtering is timewise unstable. In particular, the noise caused by the stray light in plasma creates a problem in the measurement under a condition where the intensity of measuring light becomes relatively weak.

Figure 30:
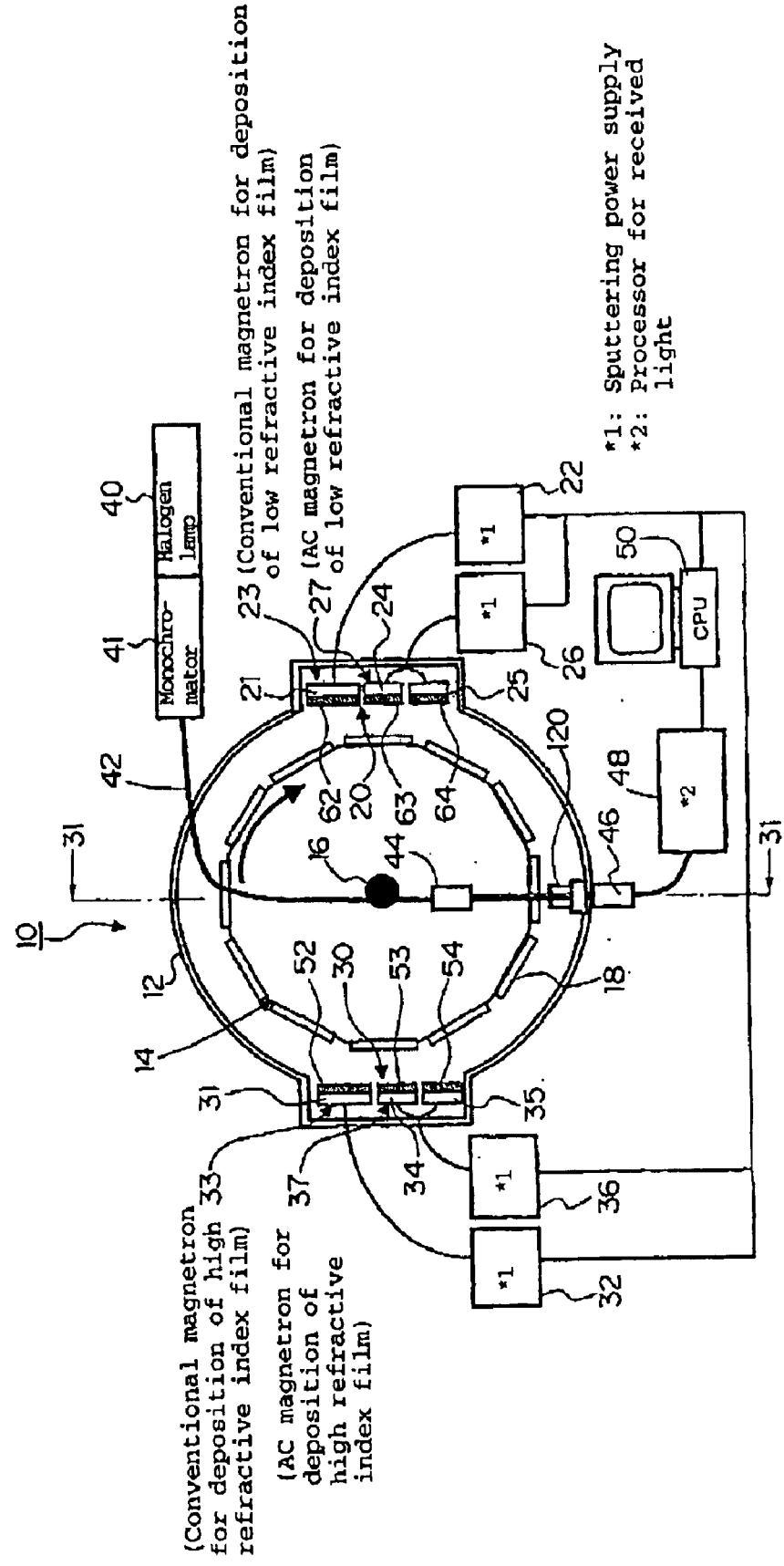
FIG. 30 is a schematic plan view showing the structure of the sputtering apparatus for depositing a multilayer optical film according to an embodiment of the present invention.

In an embodiment of the present invention, the measuring units (the light-receiving unit and the light-emitting unit) are provided in offset in the circumferential direction of the rotation of the substrate holders with respect to the film deposition spaces in order to solve this problem. In the embodiment shown in FIG. 30, the measuring units are provided at the positions farthest from the magnetrons (23, 27, 33, 37) in the circumferential direction. In FIG. 30, members corresponding to those in the embodiment shown in FIG. 1 are indicated by the same reference numerals as the embodiment shown in FIG. 1, and explanation of the members will be omitted. By keeping the monitoring position away from the film deposition spaces as shown in FIG. 30, it is possible to improve the S/N ratio and perform the monitoring with good precision.

Although the spacing amount (distance) between the film deposition spaces and the monitoring position may be designed in various ways in accordance with the structure of an actual sputtering apparatus, it is preferable that the distance is 150 mm or longer, in particular 900 mm or longer in a horizontal direction along the circumferential length on the outer wall when the intersection point of the centerline of the magnetron closest to the light-receiving unit and the outer wall of the chamber is defined as the reference point.

It is preferable that a light-shielding pipe 120, which has a length substantially equal to the distance between the chamber 12 and a substrate holder 14, is provided between the light-receiving head 46 and the light-emitting head 44, i.e., the measuring window formed in the chamber wall and the confronting substrate holder 12 to cover the light path for the measuring light. When the light-shielding pipe 120 is provided in such a floating manner to be electrically insulated from the chamber 12, it is possible to significantly shut off the stray light in plasma from the film deposition spaces.

Figure 31:
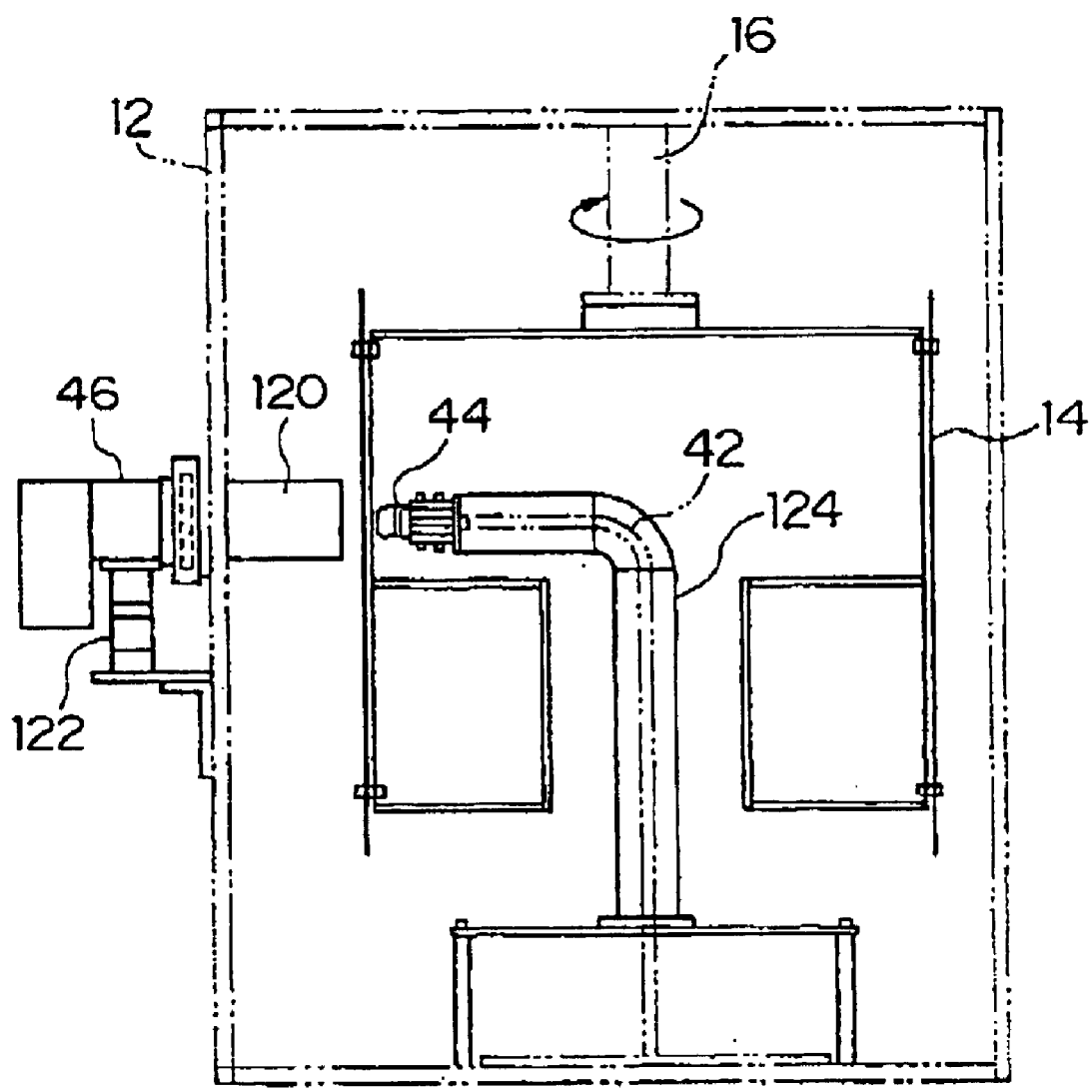
FIG. 31 is a cross-sectional view along line 31—31 of FIG. 30.

FIG. 31 is a cross-sectional view taken along line 31—31 of FIG. 30. As shown in FIG. 31, the light-receiving head 46 is provided on the outer wall of the chamber 12 through a stage 122. The light-shielding pipe 120 is mounted on the inner wall of the chamber 12 so as to cover the light path for the measuring light. Reference numeral 124 designates a supporting pipe for supporting the optical fiber 42.

Figure 32:
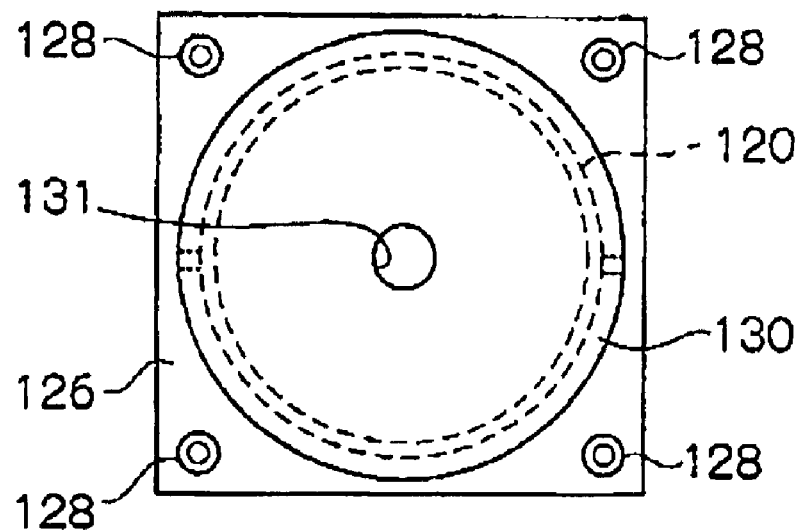
FIG. 32 is a plan view of a light-shielding pipe.
Figure 33:
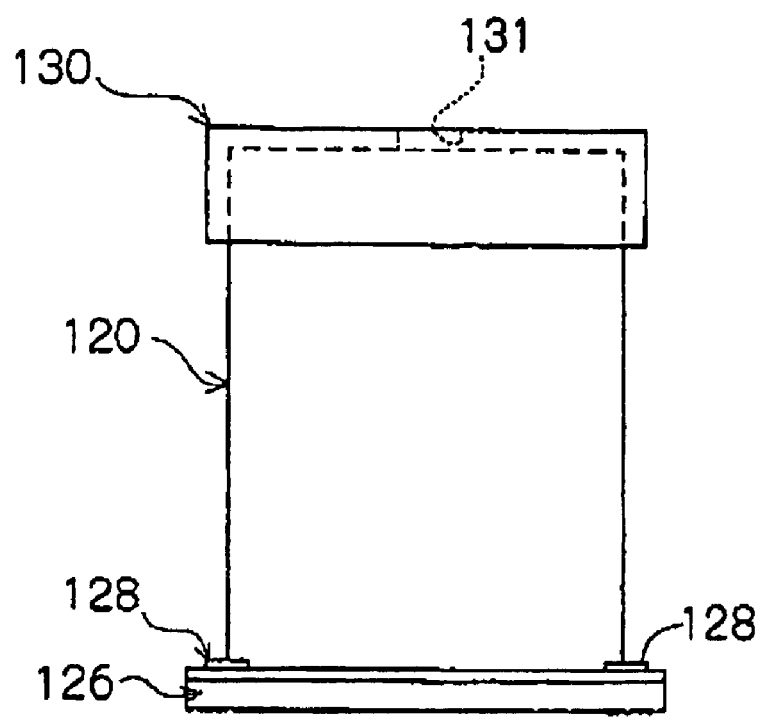
FIG. 33 is a side view of the light-shielding pipe.

FIG. 32 is a plane view of the light-shielding pipe 120, and FIG. 33 is a side view of the light-shielding pipe. The light-shielding pipe 120 has a main body made of a metallic material, such as SUS304, and the light-shielding pipe 120 is mounted to the chamber 12 through a dielectric plate 126. The light-shielding pipe is fixedly mounted by use of insulated bushing 128 and bolts (not shown). It is preferable that the dielectric plate 126 and the insulated bushing 128 are made of, e.g., Teflon (the trademark for polytetrafluoroethylene) as fluororesin. The present invention is operable in a mode wherein the light-shielding pipe 120 has the main body made of Teflon or another insulating material.

The light-shielding pipe 120 has a leading edge provided with a light-shielding lid 130. The light-shielding lid 130 is made of Teflon colored in black, and the light-shielding lid 130 has a hole 131 formed in a central portion so as to have substantially the same size as the spot diameter of the emitted light. When the main body of the light-shielding pipe 120 is provided in a floating manner, the light-shielding lid 130 may be made of a conductive material, such as SUS304. In the shown example, Black Teflon is used in view of prevention of multiple reflection in order to suppress the influence of stray light due to multiple reflection between a substrate 18 and the light-shielding lid 130.

Since the noise caused by the plasma light can be significantly reduced by this technique, the measurement can be performed with good precision even when the chopping frequency is as relatively low as 270 Hz. An experiment shows that the S/N ratio was improved by 200 times by providing the light-shielding pipe 120 in a floating potential manner. The technique described with respect to FIGS. 30 to 33 is applicable to the respective embodiments described with respect to FIGS. 1 to 26.

<Embodiment Wherein only AC Magnetrons are Used>

Explanation of each of the embodiments stated earlier has been made for the case wherein the film deposition is performed in the carousel-type sputtering apparatus with the AC magnetrons and the conventional magnetrons coexisting therein, wherein the optical property (the transmittance or the reflectance) of the deposited films is successively measured, wherein while the difference between the thickness of a film during deposition and the targeted film thickness is great, the magnetron (AC magnetron) for rapid deposition and the magnetron (conventional magnetron) for slow deposition are simultaneously discharged, and wherein when the difference to the targeted film thickness becomes small, a fine film thickness control is conducted to obtain layered films having a desired optical property by performing the film deposition only by use of the magnetron for slow deposition. This arrangement is required for a film structure, which needs a film thickness having a high precision of permissible film thickness error of 0.01% or lower, such as a bandpass filter for communication.

On the other hand, in the case of a film structure which has a permissible error on the order of about 1% to about 5% for film thickness, such as a low-reflective film for a display, a projector, lighting equipment, parts for various kinds of camera lenses and the like, an edge filter (an infrared reflective filter, an ultraviolet reflective filter, an infrared and ultraviolet reflective filter, a visual light reflective filer and the like), and a polarized filter as listed in FIG. 34, the requirements are met by an apparatus structure without magnetrons for slow film deposition.

A method and an apparatus wherein the deposition of films, the specifications of which have a permissible error in the order of about 1% for film thickness error, is performed by only magnetrons for rapid film deposition without magnetrons for slow film deposition will be described.

Figure 35:
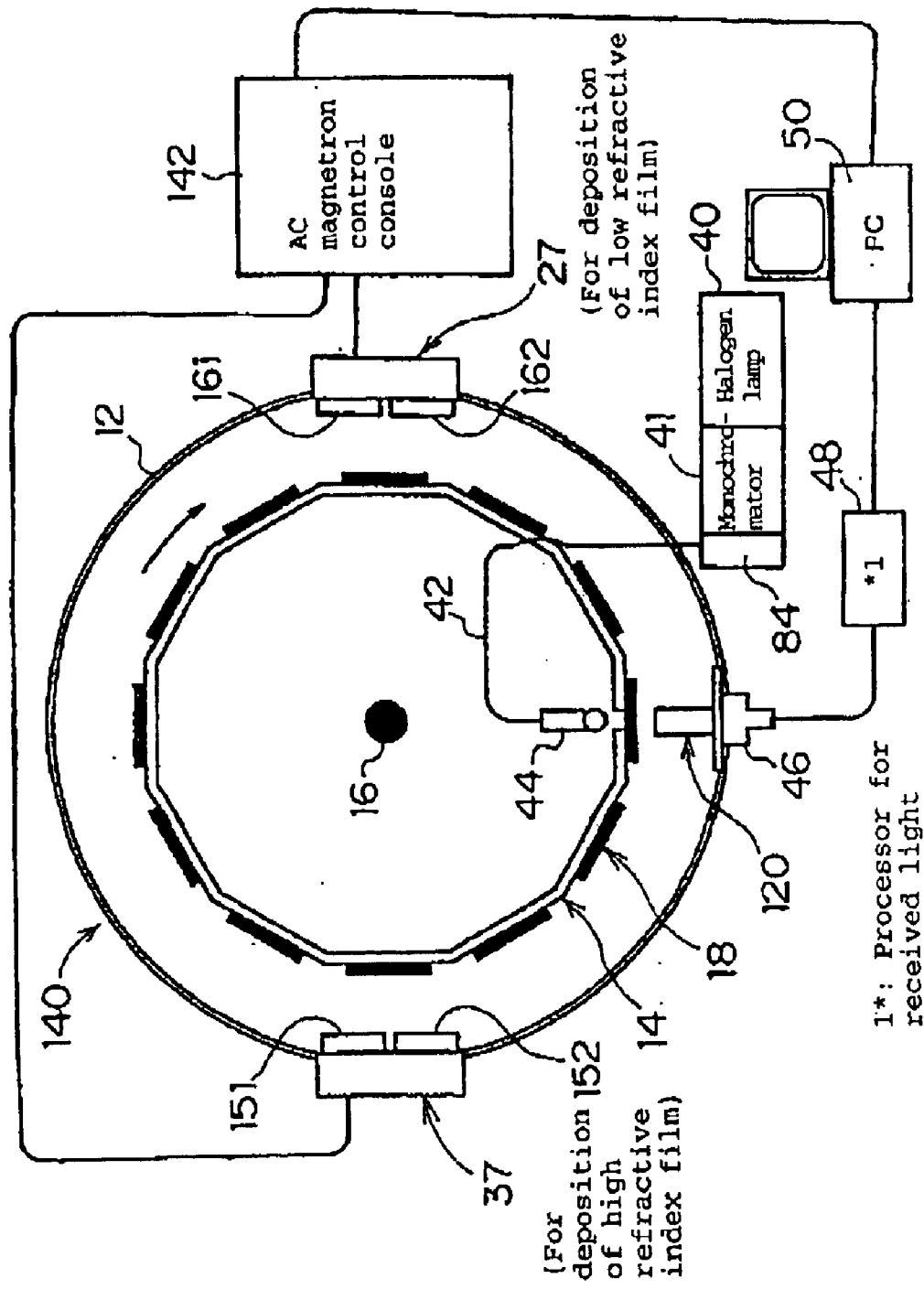
FIG. 35 is a schematic view of a film deposition apparatus using only AC magnetrons.

FIG. 35 shows a schematic view of a film deposition apparatus wherein only AC magnetrons are used. In this figure, members identical or similar to those in the embodiment shown in FIG. 1 are indicated by the same reference numerals as the embodiment shown in FIG. 1, and explanation of the members will be omitted. The film deposition apparatus 140 is a carousel-type sputtering apparatus wherein respective substrate holders 14 are combined in a regular dodecagonal shape having a diameter of 1 m and are supported so as to be rotatable about a central shaft 16 as the center of rotation in a cylindrical chamber 12 having a height of 1.5 m and a diameter of 1.5 m, AC magnetrons 27, 37, each of which has a couple of rectangular targets having a length of 1 m, are provided inside the chamber wall, and the substrate holders 14 with a substrate 18 mounted thereon are rotated at 30 rpm to pass substrates 18 in front of the AC magnetrons 27, 37, thereby to perform the film deposition. The film deposition apparatus 140 in this embodiment includes the magnetron 27 for deposition of low refractive index films and the magnetron 37 for deposition of high refractive index films.

The film deposition apparatus 140 directs light from a halogen lamp 40 to a light-emitting head 44 through a monochromator 41, a chopper 84 and an optical fiber 42 and irradiates measuring light from the light-emitting head 44 onto a substrate 18 in rotation. The light that has passed through the substrate 18 passes through a light-shielding pipe 120 between the confronting substrate holder 14 and a measuring window and is received by the integrating sphere and the photodiode of a light-receiving head 46. Thus, the transmittance of the substrate 18 and deposited films are measured while performing the film deposition.

The measurement results are fed back to a magnetron control console 142 so as to achieve a desired film thickness by calculation in a PC 50. The magnetron control console 142 is a controller, which controls devices, such as the power supply for supplying power to the AC magnetrons 27, 37. As stated earlier, the AC magnetrons are magnetrons, each of which includes two magnetron cathodes provided side by side so that when one of the magnetron serves as a cathode, the other magnetron serves as an anode, and that the cathode and the anode are interchanged by a high frequency of tens of kHz. The AC magnetrons can stably and rapidly deposit a film, such as an oxide film or a nitride film, by making a parameter control for deposition film so as to maintain the deposition conditions in a transition region of reactive sputter deposition.

With regard to the shape of the targets, the inclination type targets stated with respect to FIG. 17 and FIG. 19 are applicable.

The film deposition process using the film deposition apparatus shown in FIG. 35 will be described.

Ta targets 151, 152 are mounted on the AC magnetron for deposition of a high refractive index film 37, Si targets 161, 162 are mounted on the AC magnetron for deposition of a low refractive index film 27, and glass substrates having a thickness of 1.1 mm and an area of 10 cm square are mounted on the substrate holders 14. After that, the vacuum chamber 12 is sucked to 5 Pa by a rotary pump, not shown, and then is evacuated to $2 \times 10^{-4}$ Pa by a turbomolecular pump.

After evacuation, 370 sccm of argon gas and 180 sccm of oxygen gas are introduced into the chamber through the gas inlet tube on the side of the AC magnetron for deposition of a high refractive index film. Then, discharge is started. The film deposition is performed at a film deposition rate of about 0.4 nm per one rotation of the substrate holders while the power supply, the gas flow rate and the like are controlled so as to maintain the deposition state in the transition region or in the vicinity thereof with respect to the AC magnetron for deposition of a high refractive index film. At this time, the transmittance, which is changing, is measured every rotation while the film deposition is performed.

Between the measuring window formed in the chamber 12 and the confronting substrate holder 14 is provided the light-shielding pipe 120. As stated with respect to FIG. 32 and FIG. 33, the light-shielding pipe 120 is formed with a hole 131, which has substantially the same size as the beam diameter of light emitted from the light-emitting head 44. The light-shielding pipe is formed so as to have substantially the same length as the distance between the measuring window and the confronting substrate holder 14. The light-shielding pipe 120 can suppress the influence of the plasma spreading to the vicinity of a light-receiving unit since the light-shielding pipe has an electrically floating potential state. By this arrangement, it is possible to perform the film thickness monitoring with good precision and with rapid measurement since, even when the chopping frequency is relatively low, it is possible to perform the measurement with good precision.

The current film thickness of a deposited film with respect to a desired film thickness is computed, and the computed results are fed back to the magnetron control console 142. The deposition of each film is controlled so as to have uniformity in the rotational direction and a film thickness equal to the designed value by stopping the power supply to the AC magnetron 37 when the targeted film thickness is achieved or closing the shutter slowly (closing the shutter at such a speed that the substrate holders have rotated several turns or tens of turns until the shutter is completely closed) when the current film thickness has been brought near to the targeted film thickness.

In the feedback control stated above, improvement in the precision of the film thickness and a decrease in the time period for film deposition may be realized by changing the parameters for film deposition so as to stepwise control the film deposition in consideration of the difference between a targeted film thickness and a current film thickness.

Next, in order to perform the deposition of a $SiO_2$ film as a low refractive index film, 250 sccm of argon gas and 140 sccm of oxygen gas are introduced, and the discharge is started. The film deposition is performed at a film deposition rate of about 0.4 nm per one rotation of the substrate holders 14 while controlling the voltage to the AC magnetron 27 so as to maintain the film deposition state in the transition region or in the vicinity thereof. At this time, the AC magnetron 27 is controlled so as to achieve a desired film thickness by using a technique similar to the one for deposition of a high refractive index film to measure the transmittance every rotation.

The step to deposit a high refractive index film and the step to deposit a low refractive index film are alternately repeated to fabricate a visual light reflection filter.

Additionally, by a technique similar to the technique stated above, a multilayer film, which included ten layers of $Ta_2O_5$ (200 nm)/$SiO_2$ (200 nm)/$Ta_2O_5$ (200 nm)/$SiO_2$ (200 nm)/$Ta_2O_5$ (200 nm)/$SiO_2$ (200 nm)/$Ta_2O_5$ (200 nm)/$SiO_2$ (200 nm)/$Ta_2O_5$ (200 nm)/$SiO_2$ (200 nm), are deposited on a silicon wafer substrate having a diameter of 10 cm.

Before and after deposition of the multilayer film, the curvature radius of the silicon wafer is measured by using a FlexXus F2320 as a FIX THIN FILMS STRESS MEASUREMENT SYSTEM manufactured by Tencor Instrument Inc. Based on the deference between the measured values, it is found that the stress applied on the multilayer film is a compressive stress of 117 MPa.

FIG. 36 shows the evaluation results for the properties of multilayer films. For comparison, this figure also includes the evaluation results for a multilayer film having a thickness of 3.0 μm and 26 layers, which was deposited by only use of DC magnetrons, and the evaluation results for a multilayer film having a thickness of 4 μm and 34 layers, which was formed by vapor deposition. The measuring methods for respective items are as follows:

The film stress is found by measuring the warp (curvature radius) of the silicon wafer substrates having a diameter of 10 cm before and after film deposition by use of the FlexXus F2320 as a FIX THIN FILMS STRESS MEASUREMENT SYSTEM manufactured by Tencor Instrument Inc.

The refractive index and the extinction coefficient are found by use of a spectroscopic ellipsometer WVAS manufactured by J. A. Woollam Co., Inc.

The haze value is found by use of a hazemeter TC-HIII manufactured by Tokyo Denshoku Corporation.

The smoothness is found by use of a multiunit SPA-400 manufactured by Seiko Instruments Inc.

The wavelength shift was found as follows: 1. The spectral transmittance of the samples was measured by use of an automatic optical element measuring instrument ART-25GT manufactured by JASCO International Co., Ltd. 2. The samples were put in a small size of environmental testing instrument SH-220 manufactured by Tabaiespect Co., Ltd. and were kept at 60° C. and under 90% RH for 120 hours therein. 3. The samples were taken out of the environmental testing instrument SH-220, and the spectral transmittance of the samples was measured by use of the automatic optical element measuring instrument ART-25GT manufactured by JASCO International Co., Ltd. 4. The deviations between the measurement results obtained by items 1 and 3 were referred to as the wavelength shift.

FIG. 37 shows a list of targeted values with respect to the film properties required for optical multilayer films for reference.

As shown in FIG. 35 and FIG. 36, when the film deposition is performed only by the AC magnetrons, excellent results are provided in terms of the film stress, the refractive index, the extinction coefficient, the haze value, the smoothness and the durability (wavelength shift). When the film thickness is about 4 μm or thinner, the measurement results show that although the DC sputtering and the vapor deposition have a greater surface roughness (Ra) as the film thickness increased, the AC sputtering has a surface roughness of as small as about 0.5 nm irrespectively of the film thickness.

INDUSTRIAL APPLICABILITY

As stated earlier, in accordance with the present invention, the film thickness is monitored during film deposition in a carousel-type sputtering apparatus, and the parameters affecting on the amount of the film deposition are controlled based on the information obtained by the monitoring. Thus, it is possible to control the film thickness accurately and to form a film so as to achieve a desired film thickness with good productivity.

In accordance with one of the modes of the present invention, the AC magnetron sputtering sources and the magnetron sputtering sources with a target mounted on a single magnetron unit are combined, rapid film deposition is performed by the AC magnetron sputtering sources until the film thickness achieves a certain value just smaller than a designed film thickness (targeted film thickness), the deposition by the AC magnetron sputtering sources is stopped after the film thickness has achieved the certain value, and then the film deposition is performed only by the magnetron sputtering sources with a target mounted on a single magnetron unit. Thus, it is possible to control the film thickness with high precision and perform the film deposition with good productivity.

When the profile showing the relationship between the incident angle of measuring light and the transmittance or the reflectance is utilized as the method for measuring the film thickness, it is possible to reliably determine the completion of the film deposition and the like.

In accordance with one of the modes of the present invention, it is possible to make an approximate conversion based on the dependency of an incident angle respect with the transmittance or the reflectance, and to grasp the profile of the spectral transmittance or the spectral reflectance in real time. By feeding back the profile to the film thickness control operation, it is possible to complete final products in desired specifications (desired optical specifications). Thus, it is possible to drastically improve the production yield.

In accordance with one of the modes of the present invention, it is possible to easily make the film thickness uniform in the advancing direction of the substrates in a carousel-type sputtering apparatus by using the inclination type targets in place of the conventional flat targets or using the inclination type targets as well as a conventional flat target. When an attempt is made to make the film thickness uniform by the sputtering method (apparatus) wherein two cathodes and two power supplies for applying power to the cathodes are used as disclosed in JP-A-3-253568, the two cathodes need to have an equal film deposition rate. However, it is actually difficult to minimize the differences between the cathodes in terms of factors affecting on the film deposition rate. In accordance with the method and the apparatus of the present invention, the cathode-power system, which is required to make the film thickness uniform, can be configured as a single power supply. As a result, the method and the apparatus according to the present invention offer advantages that it is possible to minimize the factors stated earlier, to more simply make the film thickness uniform and to make the apparatus smaller and more economical than the conventional apparatuses.

It is possible to perform the film deposition by using only the AC magnetrons without using the DC magnetrons when the required precision for the film thickness is not so high. By performing the film deposition only by use of the AC magnetrons, it is possible to obtain a multilayer film having excellent properties.

When the measuring position is far from the film deposition spaces in order to increase the precision in the film thickness measurement, it is possible to decrease the adverse effect by plasma light in measurement. When the light-shielding pipe is provided to encircle the light path where measuring light is passing, and when the light-shielding pipe is electrically insulated from the chamber so as to be electrically floating, the stray light in plasma from the film deposition spaces can be significantly shut off.

The entire disclosures of Japanese Patent Application No. 2001-031004 filed on Feb. 7, 2001, Japanese Patent Application No. 2001-220942 filed on Jul. 23, 2001 and Japanese Patent Application No. 2001-383069 filed on Dec. 17, 2001 including specifications, claims, drawings and summaries are incorporated herein by reference in their entireties.

What is claimed is:

1. A carousel sputtering apparatus which is configured so that a drum, which is formed in a polygonal or circular shape in transverse cross-section, is provided so as to be rotatable in a chamber, the drum having substrate holders provided on an outer peripheral surface;

magnetron sputtering sources are provided inside a chamber wall;

each of the magnetron sputtering sources comprises a target and a magnetron unit for holding the target; and the targets are held so as to be parallel with a rotary axis of the drum by the magnetron units;

the sputtering apparatus comprising:

a film thickness measuring instrument, which measures a thickness of a film deposited on a substrate mounted on one of said substrate holders during film deposition;

a power supply unit, which supplies the respective targets with power required for sputtering; and a controller, which controls parameters affecting on an amount of film deposition, based on measurement results obtained by the film thickness measuring instrument, wherein each of the magnetron sputtering sources comprises an AC magnetron sputtering source and a magnetron sputtering source with a target mounted on a single magnetron unit, and the AC magnetron sputtering source having two adjacent targets provided thereon such that an anode/cathode relationship between the two targets is alternately changed by a frequency.

2. The sputtering apparatus according to claim 1, wherein the controller makes such a control that rapid film deposition is performed by an AC magnetron sputtering source from start of film deposition, the film deposition by the AC magnetron sputtering source is stopped after the thickness of the film as achieved a value just smaller than a targeted film thickness, and then the rapid film deposition is changed to slow film deposition only by use of a magnetron sputtering source with a target mounted on a single magnetron unit to perform the film deposition up to achievement of the targeted film thickness.

3. The sputtering apparatus according to claim 2, wherein the controller makes such a control that the thickness of the film is monitored by the film thickness measuring instrument during slow film deposition, and that when it is detected that the thickness of the film has achieved the targeted film thickness, the film deposition by the magnetron sputtering source with a target mounted on a single magnetron unit is stopped.

4. The sputtering apparatus according to claim 1, wherein the magnetron sputtering sources are a combination of a magnetron sputtering source for mounting a target for deposition of a low refractive index film, and a magnetron sputtering source for mounting a target for deposition of a high refractive index film.

5. The sputtering apparatus according to claim 1, wherein the film thickness measuring instrument comprises a light emitter for radiating measuring light onto a substrate and a light receiver for receiving transmitted light or reflected light of the measuring light radiated onto the substrate to generate electrical signal in response to a receiving amount of the transmitted light or the reflected light, wherein while the drum is rotated, the measuring light is radiated onto the substrate from the light emitter to measure the film thickness.

6. The sputtering apparatus according to claim 5, further comprising a calculating means for finding transmittance information or reflectance information based on the signal output from the light receiver.

7. The sputtering apparatus according to claim 5, wherein the film thickness measuring instrument is provided at a position far from the magnetron sputtering sources.

8. The sputtering apparatus according to claim 1, further comprising:
   AC magnetron sputtering sources, each having two adjacent targets provided thereon such that an anode/cathode relationship between the two targets is alternately changed by a frequency;
   magnetron sputtering sources with a target mounted on a single magnetron unit; and
   a controller, which makes such a control that rapid film deposition is performed by an AC magnetron sputtering source from start of film deposition, the film deposition by the AC magnetron sputtering source is stopped after the thickness of the film has achieved a value just smaller than a targeted film thickness, and then the rapid film deposition is changed to slow film deposition only by use of a magnetron sputtering source with a target mounted on a single magnetron unit to perform the film deposition up to achievement of the targeted film thickness.

9. A carousel sputtering apparatus which is configured so that a drum, which is formed in a polygonal or circular shape in transverse cross-section, is provided so as to be rotatable in a chamber, the drum having substrate holders provided on an outer peripheral surface; and
   magnetron sputtering sources are provided inside a chamber wall, each of the magnetron sputtering sources comprising a target and a magnetron unit for holding the target, and the targets being held so as to be parallel with a rotary axis of the drum by the magnetron units;
   the sputtering apparatus comprising:
   the magnetron sputtering sources including only AC magnetron sputtering sources, each of which has two adjacent targets provided thereon such that an anode/cathode relationship between the two targets is alternately change by a frequency;
   a film thickness measuring instrument, which measures a thickness of a film deposited on a substrate mounted on a substrate holder during film deposition while rotating the drum;
   a power supply unit, which supplies the respective targets with power required for sputtering; and
   a controller, which controls parameters affecting on an amount of film deposition, based on measurement results obtained by the film thickness measuring instrument.

10. The sputtering apparatus according to claim 9, wherein the magnetron sputtering sources are a combination of a magnetron sputtering source for mounting a target for deposition of a low refractive index film, and a magnetron sputtering source for mounting a target for deposition of a high refractive index film.

11. The sputtering apparatus according to claim 9, wherein the film thickness measuring instrument comprises a light emitter for radiating measuring light onto a substrate and a light receiver for receiving transmitted light or reflected light of the measuring light radiated onto the substrate to generate an electrical signal in response to a receiving amount of the transmitted light or the reflected light, wherein while the drum is rotated, the measuring light is radiated onto the substrate from the light emitter to measure the film thickness.

12. The sputtering apparatus according to claim 11, further comprising a calculating means for finding transmittance information or reflectance information based on the signal output from the light receiver.

13. A carousel sputtering apparatus which is configured so that a drum, which is formed in a polygonal or circular shape in transverse cross-section, is provided so as to be rotatable in a chamber, the drum having substrate holders provided on an outer peripheral surface;
   magnetron sputtering sources are provided inside chamber wall;
   each of the magnetron sputtering sources comprises a target and a magnetron unit for holding the target; and
   the targets are held so as to be parallel with a rotary axis of the drum by the magnetron units;
   the sputtering apparatus comprising:
   a film thickness measuring instrument, which measures a thickness of a film deposited on a substrate mounted on one of said substrate holders during film deposition;
   a power supply unit, which supplies the respective targets with power required for sputtering; and
   a controller, which controls parameters affecting on an amount of film deposition, based on measurement results obtained by the film thickness measuring instrument, wherein:
   the film thickness measuring instrument comprise a light emitter for radiating measuring light onto a substrate and a light receiver for receiving transmitted light or reflected light of the measuring light radiated onto the substrate to generate an electrical signal in response to a receiving amount of the transmitted light or the reflected light, wherein while the drum is rotated, the measuring light is radiated onto the substrate from the light emitter to measure the film thickness,
   the apparatus further comprises a calculating means for finding transmittance information or reflectance information based on the signal output from the light receiver, and
   the calculating means finds the transmittance information or the reflectance information in response to the incident angles based on signals obtained from the light receiver when incident angle of the measuring light is 0 deg and when the incident angle is in an angular range in the vicinity thereof, thereby to acquire data showing a relationship between the incident angle and transmittance or reflectance.

14. The sputtering apparatus according to claim 13, wherein the calculating means makes approximate conversion based on data showing the relationship between the incident angle and the transmittance or the reflectance to find spectral transmittance or spectral reflectance.

15. A carousel sputtering apparatus which is configured so that drum, which is formed in a polygonal or circular shape in transverse cross-section, is provided so as to be rotatable in a chamber, the drum having substrate holders provided on an outer peripheral surface;
   magnetron sputtering sources are provided inside a chamber wall;
   each of the magnetron sputtering sources comprises a target and a magnetron unit for holding the target; and
   the targets are held so as to be parallel with a rotary axis of the drum by the magnetron units;
   the sputtering apparatus comprising:
   a film thickness measuring instrument, which measures a thickness of a film deposited on a substrate mounted on one of said substrate holders during film deposition;
   a power supply unit, which supplies the respective targets with power required for sputtering; and
   a controller, which controls parameters affecting on an amount of film deposition, based on measurement results obtained by the film thickness measuring instrument, wherein the film thickness measuring instrument comprises a light emitter capable of selectively radiating a plural kinds of measuring light having different wavelengths onto the substrate, and a light receiver for receiving transmitted light or reflected light of the measuring light radiated onto the substrate to generate an electrical signal in response to a receiving amount of the transmitted light or the reflected light, wherein while the drum is rotated, the measuring light is radiated onto the substrate from the light emitter to measure the thickness.

16. The sputtering apparatus according to claim 15, further comprising a calculating means for finding transmittance information or reflectance information for the plural kinds of measuring light having different wavelengths based on the signal output from the light receiver.

17. The sputtering apparatus according to claim 16, wherein the calculating means finds transmittance or reflectance for the plural kinds of measuring light having different wavelengths, in response to incident angles based on signals obtained from the light receiver when incident angle of the measuring light is 0 deg and when the incident angle is in an angular range in the vicinity thereof, thereby to acquire data showing a relationship between the incident angle and transmittance or reflectance.

18. A carousel sputtering apparatus which is configured so that a drum, which is formed in a polygonal or circular shape in transverse cross-section, is provided so as to be rotatable in a chamber, the drum having substrate holders provided on an outer peripheral surface;

magnetron sputtering sources are provided inside a chamber wall;

each of the magnetron sputtering sources comprises a target and a magnetron unit for holding the target; and the targets are held so as to be parallel with a rotary axis of the drum by the magnetron units;

the sputtering apparatus comprising:

a film thickness measuring instrument, which measures a thickness of a film deposited on a substrate mounted on one of said substrate holders during film deposition;

a power supply unit, which supplies the respective targets with power required for sputtering; and a controller, which controls parameters affecting on an amount of film deposition, based on measurement results obtained by the film thickness measuring instrument, wherein the film thickness measuring instrument comprises a light emitter for radiating measuring light onto a substrate and a light receiver for receiving transmitted light or reflected light of the measuring light radiated onto the substrate to generate an electrical signal in response to a receiving amount of the transmitted light or the reflected light, wherein while the drum is rotated, the measuring light is radiated onto the substrate from the light emitter to measure the film thickness, and wherein a light-shielding pipe is provided between an inner wall of the chamber and the substrate holders so as to encircle a light path where the transmitted light or the reflected light of the measuring light is passing.

19. The sputtering apparatus according to claim 18, wherein the light-shielding pipe is electrically insulated from the chamber.

20. The sputtering apparatus according to claim 18, wherein the light-shielding pipe has a leading edge provided with a reflection preventing member for reducing multiple reflection between the substrates and the leading edge.

21. A carousel sputtering apparatus which is configured so that a drum, which is formed in a polygonal or circular shape in transverse cross-section, is provided so to be rotatable in a chamber, the drum having substrate holders provided on an outer peripheral surface;

magnetron sputtering sources are provided inside a chamber wall;

each of the magnetron sputtering sources comprises a target and a magnetron unit for holding the target; and the targets are held so as to be parallel with a rotary axis of the drum by the magnetron units;

the sputtering apparatus comprising:

a film thickness measuring instrument, which measures a thickness of a film deposited on a substrate mounted on one of said substrate holders during film deposition;

a power supply unit, which supplies the respective targets with power required for sputtering; and a controller, which controls parameters affecting on an amount of film deposition, based on measurement results obtained by the film thickness measuring instrument, wherein the target has a target surface inclined at such an inclination angle that when the target is located in a positional relationship to confront the substrate, the target surface is prevented from being parallel with a surface of the substrate.

22. A sputter film deposition method using a sputtering apparatus which comprises AC magnetron sputtering sources, each having two adjacent targets provided thereon such that an anode/cathode relationship between the two targets is alternately changed by a frequency, and magnetron sputtering sources with a target mounted on a single magnetron unit;

the method comprising performing rapid film deposition by use of an AC magnetron sputtering source from start of film deposition, stopping th film deposition by the AC magnetron sputtering source after the thickness of the film has achieved a value just smaller than a targeted film thickness, and then changing the rapid film deposition to slow film deposition only by use of a magnetron sputtering source with a target mounted on a single magnetron unit to perform the film deposition up to achievement of the targeted film thickness.

23. The method according to claim 22, further comprising measuring a film thickness during film deposition; and controlling parameters affecting on an amount of film deposition based on measurement results obtained by the film thickness measuring step.

24. The method according to claim 23, further comprises radiating measuring light onto the substrate while rotating a drum; and receiving transmitted light or reflected light of the measuring light radiated onto the substrate to generate an electrical signal in response to a receiving amount of the transmitted light or the reflected light.

25. The method according to claim 24, further comprising calculating transmittance information or reflectance information based on the signal output from the light receiving step.

26. The method according to claim 23, wherein the film thickness is measured at a position far from the magnetron units so as to minimize an adverse effect by plasma light generated in the magnetron units.

27. A sputter film deposition method using a carousel sputtering apparatus which is configured so that a drum, which is formed in a polygonal or circular shape in transverse cross-section, is provided so as to be rotatable in a chamber, the drum having substrate holders provided on outer peripheral surface; and magnetron sputtering sources are provided inside a chamber wall, each of the magnetron sputtering sources comprising a target and a magnetron unit for holding the target, and the targets being held so as to be parallel with a rotary axis of the drum by the magnetron units;

the method comprising:

using, as the magnetron sputtering sources, only AC magnetron sputtering sources, each of which has two adjacent targets provided thereon such that an anode/cathode relationship between the two targets is alternately change by a frequency, an depositing a film on a substrate mounted on a substrate holder while rotating the drum;

measuring a thickness of the film deposited on the substrate mounted on the substrate holder during film deposition while rotating the drum; and controlling parameters affecting on an amount of film deposition based on measurement results obtained by the film thickness measuring step.

28. A sputter film deposition method using a carousel sputtering apparatus which is configured so that a drum, which is formed in a polygonal or circular shape in transverse cross-section, is provided so as to be rotatable in a chamber, the drum having substrate holders provided on an outer peripheral surface; magnetron sputtering sources are provided inside a chamber wall; each of the magnetron sputtering sources comprises a target and a magnetron unit for holding the target; and the targets are held so as to be parallel with a rotary axis of the drum by the magnetron units;

the method comprising:

measuring a thickness of a film deposited on a substrate mounted on one of said substrate holders during film deposition;

controlling parameters affecting on an amount of film deposition, based on measurement results obtained by the film thickness measuring step;

radiating measuring light onto the substrate while rotating the drum; and receiving transmitted light or reflected light of the measuring light radiated onto the substrate to generate an electrical signal in response to a receiving amount of the transmitted light or the reflected light; and calculating transmittance information or reflectance information based on the signal output from the light receiving step, wherein the calculating step comprising finding transmittance or reflectance in response to the incident angles based on signals obtained from the light receiver when incident angle of the measuring light is 0 deg and when the incident angle is in an angular range in the vicinity thereof, thereby to acquire data showing a relationship between the incident angle and the transmittance or the reflectance.

29. The method according to claim 28, wherein the calculating step comprises making approximate conversion based on the relationship between the incident angle and the transmittance or the reflectance to find spectral transmittance or spectral reflectance.

30. A sputter film deposition method using a carousel sputtering apparatus which is configured so that a drum, which is formed in a polygonal or circular shape in transverse cross-section, is provided so as to be rotatable in a chamber, the drum having substrate holders provided on an outer peripheral surface; magnetron sputtering sources are provided inside a chamber wall; each of the magnetron sputtering sources comprises a target and a magnetron unit for holding the target; and the targets are held so as to be parallel with a rotary axis of the drum by the magnetron units;

the method comprising:

measuring a thickness of a film deposited on a substrate mounted on one of said substrate holders during film deposition; and controlling parameters affecting on an amount of film deposition, based on measurement results obtained by the film thickness measuring step, wherein the film thickness measuring step comprises selectively radiating a plural kinds of measuring light having different wavelengths onto the substrate while rotating the drum; and receiving transmitted light or reflected light of the measuring light radiated onto the substrate to generate an electrical signal in response to a receiving amount of the transmitted light or the reflected light.

31. The method according to claim 30, further comprising calculating transmittance or reflectance for the plural kinds of measuring light having different wavelengths based on the signal obtained in the light receiving step.

32. The method according to claim 31, wherein the calculating step comprising finding the transmittance or the reflectance for the plural kinds of measuring light having different wavelengths, in response to incident angles based on signals obtained from the light receiver when incident angle of the measuring light is 0 deg when the incident angle is in an angular range in the vicinity thereof, thereby to acquire data showing a relationship between the incident angle and the transmittance or reflectance.

33. A sputter film deposition method using a carousel sputtering apparatus which is configured so that a drum, which is formed in a polygonal or circular shape in transverse cross-section, is provided so as to be rotatable in a chamber, the drum having substrate holders provided on an outer peripheral surface; magnetron sputtering sources are provided inside a chamber wall; each of the magnetron sputtering sources comprises a target and a magnetron unit for holding the target; and the targets are held so as to be parallel with a rotary axis of the drum by the magnetron units;

the method comprising:

measuring a thickness of a film deposited on a substrate mounted on one of said substrate holders during film deposition;

controlling parameters affecting on an amount of film deposition, based on measurement results obtained by the film thickness measuring step;

radiating measuring light onto the substrate while rotating the drum;

receiving transmitted light or reflected light of the measuring light radiated onto the substrate to generate an electrical signal in response to a receiving amount of the transmitted light or the reflected light; and further reducing adverse effect by unnecessary light from outside by encircling by a light-shielding pipe a light path where the transmitted light or the reflected light of the measuring light is passing.

34. A sputter film deposition method using a carousel sputtering apparatus which is configured so that a drum, which is formed in a polygonal or circular shape in transverse cross-section, is provided so as to be rotatable in a chamber, the drum having substrate holders provided on an outer peripheral surface; magnetron sputtering sources are provided inside a chamber wall; each of the magnetron sputtering sources comprises a target and a magnetron unit for holding the target; and the targets are held so as to be parallel with a rotary axis of the drum by the magnetron units:

the method comprising:

measuring a thickness of a film deposited on a substrate mounted on one of said substrate holders during film deposition; and controlling parameters affecting on an amount of film deposition, based on measurement results obtained by the film thickness measuring step, wherein using a target, which has a target surface inclined such that when the target is located in a positional relationship to confront the substrate, the target surface is prevented from being parallel with a surface of the substrate.

* * * * *